(12) United States Patent
Clavette

(10) Patent No.: US 12,154,937 B2
(45) Date of Patent: Nov. 26, 2024

(54) INDUCTOR DEVICES AND STACKED POWER SUPPLY TOPOLOGIES

(71) Applicant: Infineon Technologies Austria AG, Villach (AT)

(72) Inventor: Danny Clavette, Greene, RI (US)

(73) Assignee: Infineon Technologies Austria AG, Villach (AT)

( * ) Notice: Subject to any disclaimer, the term of this patent is extended or adjusted under 35 U.S.C. 154(b) by 250 days.

(21) Appl. No.: 17/536,646

(22) Filed: Nov. 29, 2021

(65) Prior Publication Data
US 2023/0170380 A1 Jun. 1, 2023

(51) Int. Cl.
| | | |
|---|---|---|
| H01L 23/522 | (2006.01) | |
| H01F 17/04 | (2006.01) | |
| H01F 27/06 | (2006.01) | |
| H01F 27/28 | (2006.01) | |
| H01F 27/29 | (2006.01) | |
| H01L 23/64 | (2006.01) | |
| H01L 49/02 | (2006.01) | |
| H02M 1/00 | (2007.01) | |
| H02M 3/00 | (2006.01) | |
| H02M 3/28 | (2006.01) | |

(52) U.S. Cl.
CPC .......... *H01L 28/10* (2013.01); *H01L 23/5227* (2013.01); *H01L 23/645* (2013.01)

(58) Field of Classification Search
CPC ... H01L 28/10; H01L 23/645; H01L 23/5227; H01F 27/06; H01F 27/28; H01F 27/29; H01F 27/292; H01F 27/306; H02M 3/003; H02M 3/285
See application file for complete search history.

(56) References Cited

U.S. PATENT DOCUMENTS

| | | | |
|---|---|---|---|
| 8,174,348 B2 | 5/2012 | Ikriannikov | |
| 9,263,177 B1 | 2/2016 | Ikriannikov et al. | |
| 9,336,941 B1* | 5/2016 | Ikriannikov | ............ H01F 27/29 |
| 9,691,538 B1* | 6/2017 | Ikriannikov | .......... H02M 3/155 |
| 2004/0150500 A1* | 8/2004 | Kiko | ....................... H01F 27/38 336/90 |
| 2013/0127434 A1 | 5/2013 | Ikriannikov | |
| 2019/0379334 A1* | 12/2019 | Krvavac | ............... H01L 23/642 |
| 2022/0376628 A1* | 11/2022 | Zhou | ....................... H02M 3/01 |

FOREIGN PATENT DOCUMENTS

CN 1310258 C 4/2007

OTHER PUBLICATIONS

Extended European Search Report, EP 22 20 9894, Apr. 11, 2023, pp. 1-10.

* cited by examiner

*Primary Examiner* — Omar F Mojaddedi
(74) *Attorney, Agent, or Firm* — Armis IP Law, LLC

(57) ABSTRACT

An inductor device may include a first electrically conductive path and a second electrically conductive path. The first electrically conductive path may extend from a first terminal of the inductor device to a second terminal of the inductor device. The second electrically conductive path may extend from a third terminal of the inductor device to a fourth terminal of the inductor device. The second electrically conductive path may be magnetically coupled to the first electrically conductive path. Each of the third terminal and the fourth terminal may be offset with respect to a virtual axis extending through the first terminal and the second terminal.

35 Claims, 12 Drawing Sheets

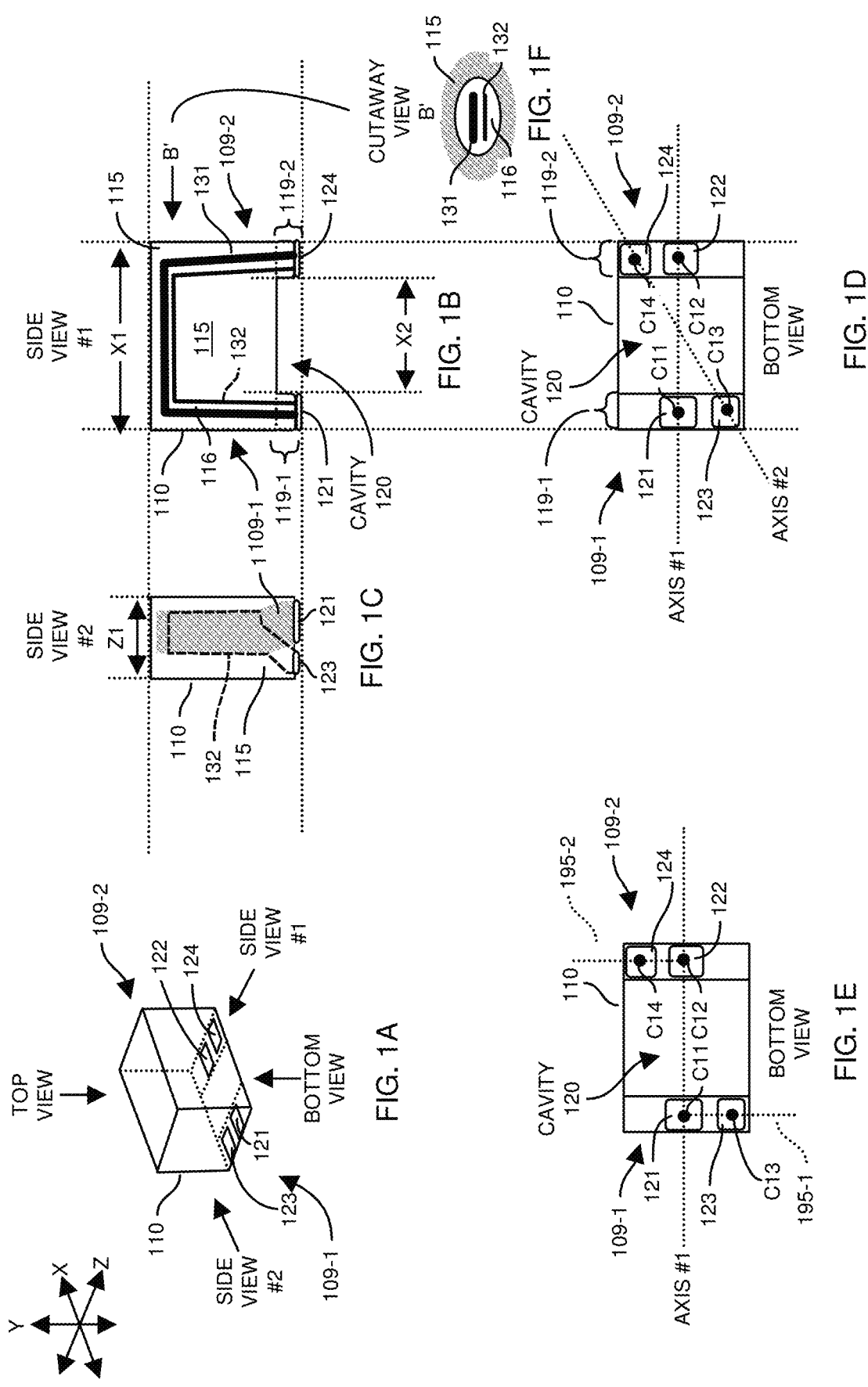

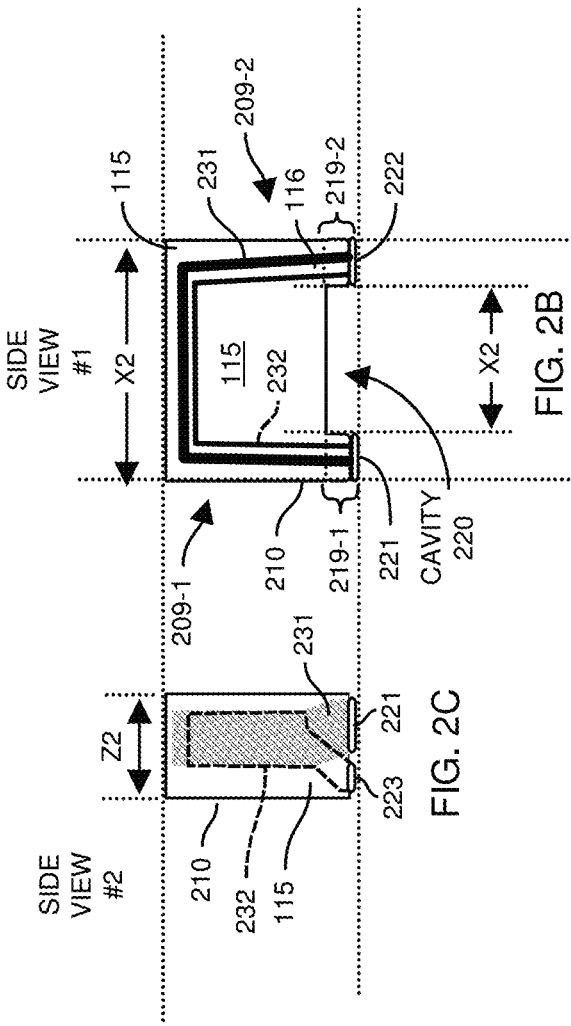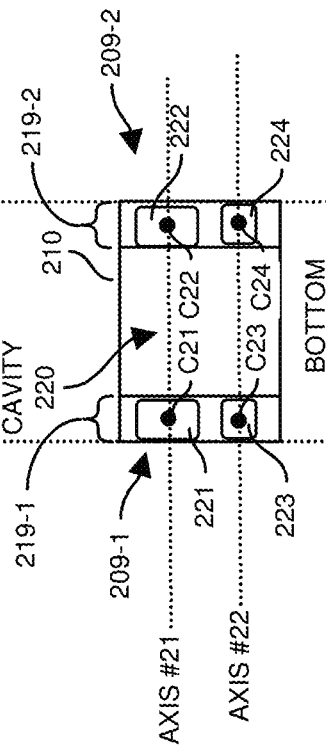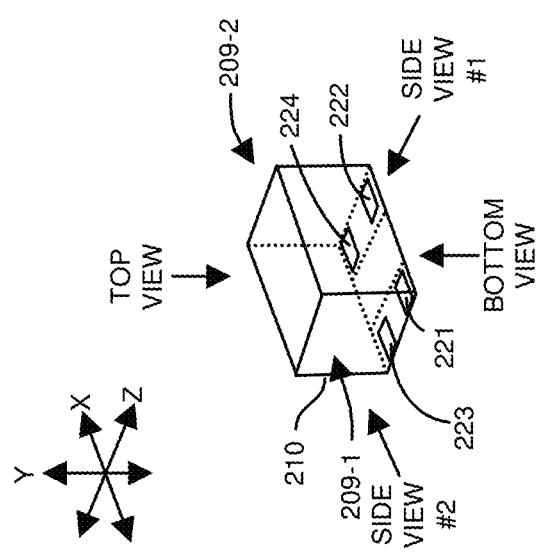

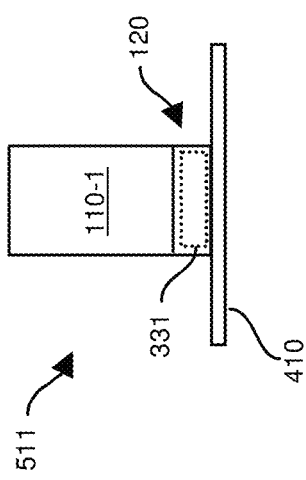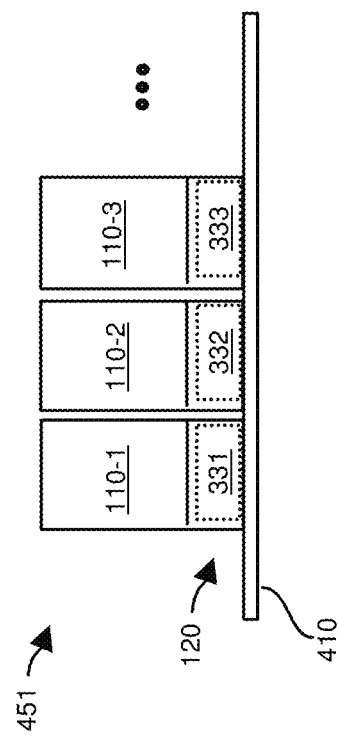

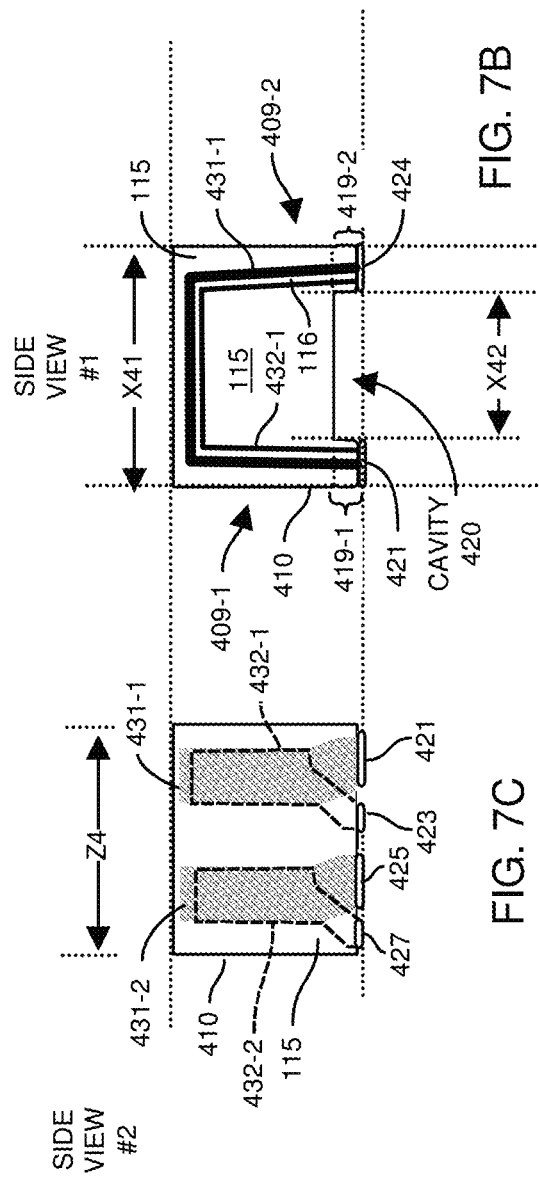
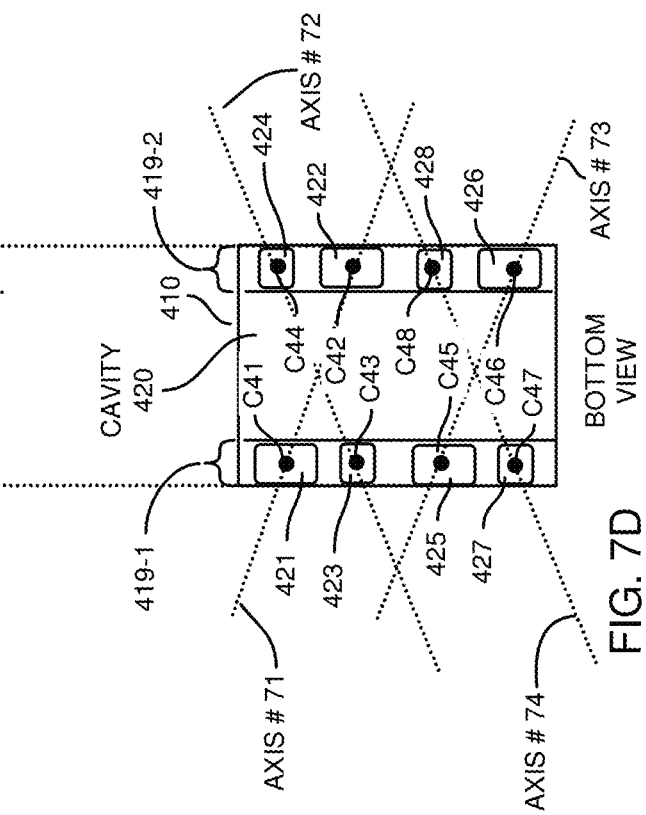
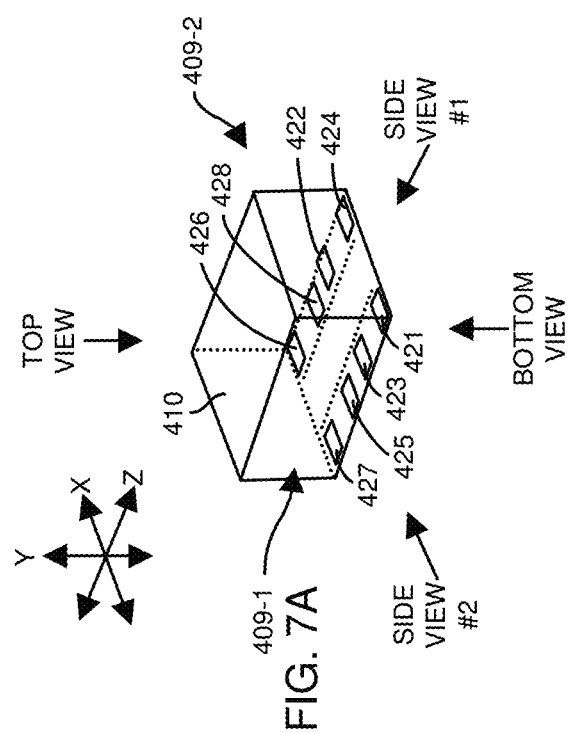

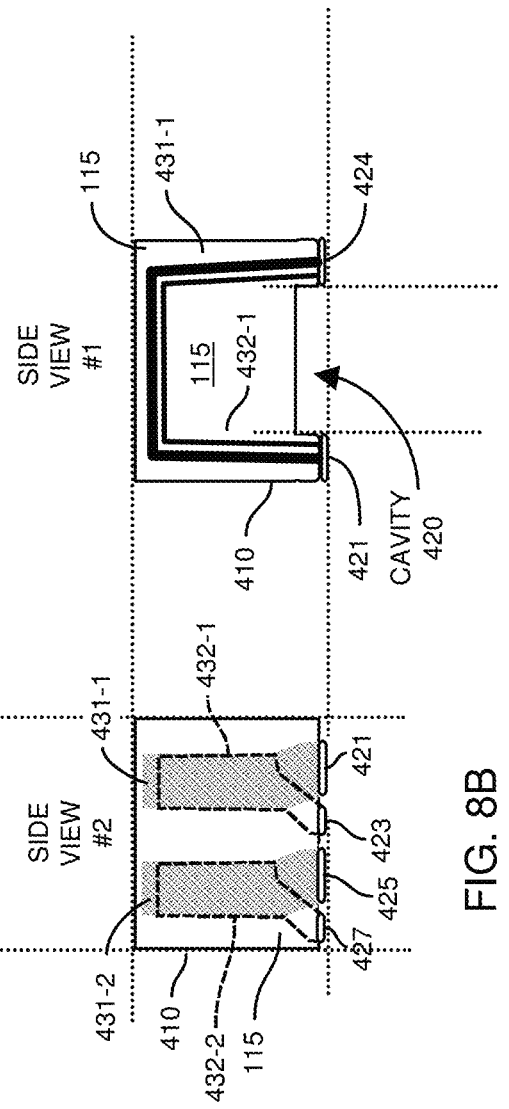
FIG. 8A
FIG. 8B
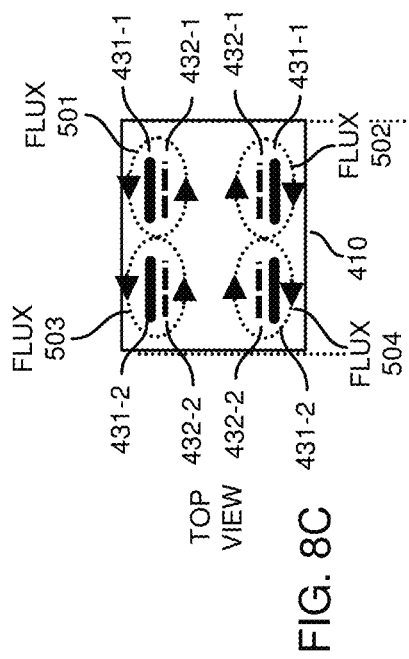
FIG. 8C

INDUCTOR DEVICES AND STACKED POWER SUPPLY TOPOLOGIES

BACKGROUND

Conventional switching power supply circuits sometimes include an energy storage component such as an inductor or transformer to produce an output voltage that powers a load. For example, to maintain a magnitude of an output voltage within a desired range, a controller controls switching of current through one or more inductors to produce an output voltage that powers a load.

In general, a conventional inductor is a component comprising of a wire or other conductive material, which is shaped as a coil or helix to increase an amount of magnetic flux through a respective circuit path. Winding a wire into a coil of multiple turns is useful because it increases the number of respective magnetic flux lines in a respective inductor component, increasing the magnetic field and thus overall inductance of the respective inductor component.

The combination of multiple magnetically coupled windings is called a transformer. In general, as is known in the art, the flow of current through a primary winding of a transformer causes a flow of current in a secondary winding of the transformer. As previously discussed, proper control of current through an inductor and/or transformer produces a respective output voltage.

BRIEF DESCRIPTION

This disclosure includes the observation that conventional inductor components are suited for planar circuit applications in which a respective planar surface of a power supply circuit board is populated with multiple different components that are, in turn, coupled to each other via circuit traces disposed on the planar surface. Such topologies (providing horizontal power flow in the power supply circuit board) inevitably make it difficult to create a compact, efficient, and high current output power supply circuit. Thus, conventional power supply circuits implementing one or more inductors via windings are sometimes undesirable.

In contrast to conventional techniques, this disclosure includes novel and improved inductor components, inductor assemblies, circuit assemblies, etc.

More specifically, an inductor device as discussed herein may include a first electrically conductive path and a second electrically conductive path. The first electrically conductive path may extend from a first terminal of the inductor device to a second terminal of the inductor device. The second electrically conductive path may extend from a third terminal of the inductor device to a fourth terminal of the inductor device. The second electrically conductive path may be magnetically coupled to the first electrically conductive path. Each of the third terminal and the fourth terminal may be offset with respect to a virtual axis extending through a center of the first terminal and a center of the second terminal.

The third terminal and the fourth terminal may be disposed on opposite sides of the virtual axis. Alternatively, the third terminal and the fourth terminal may be disposed on a same side of the virtual axis.

Further, the first terminal and the third terminal may be disposed at a first axial end of the inductor device; the second terminal and the fourth terminal may be disposed at a second axial end of the inductor device opposite the first axial end. A surface region of the third terminal may not overlap the virtual axis; and a surface region of the fourth terminal may not overlap the virtual axis.

The inductor device may include a core structure at least partially fabricated from magnetic permeable material and one or more standoffs. In such an instance, the first electrically conductive path extends from the first terminal through the magnetic permeable material to the second terminal; the second electrically conductive path extends from the third terminal through the magnetic permeable material to the fourth terminal. The inductor device may include a cavity disposed in the core structure. The cavity may be a void in the core structure between respective standoffs, the cavity disposed between the first axial end of the inductor device and the second axial end of the inductor device.

Still further, the virtual axis through the first terminal and the second terminal is a first virtual axis; the inductor device may include a second virtual axis extending through the third terminal and the fourth terminal is non-parallel with respect to the first virtual axis.

The virtual axis through the first terminal and the second terminal may be a first virtual axis. The inductor device may include a second virtual axis extending through the third terminal and the fourth terminal crosses the first virtual axis.

The inductor device can be any suitable type of device. For example, the inductor device may be a surface mount device. The first terminal, the second terminal, the third terminal, and the fourth terminal, may include exposed surface areas. The first terminal, the second terminal, the third terminal, and the fourth terminal may reside in a common plane of the surface mount device.

Note that the inductor device may further include a core structure at least partially fabricated from or including magnetically permeable material. The first electrically conductive path and the second electrically conductive path may extend through the magnetic permeable material of the core structure.

Yet further, the inductor device may include a bottom surface. The first terminal, the second terminal, the third terminal, and the fourth terminal may be implemented as metallic pads disposed on the bottom surface of the inductor device. The inductor device may further include a second surface disposed opposite the first surface. If desired, a portion of the first electrically conductive path exposed on the first surface.

The virtual axis as previously discussed may be a first virtual axis. The inductor device may include additional electrically conductive paths. For example, the inductor device may include a third electrically conductive path extending from a fifth terminal of the inductor device to a sixth terminal of the inductor device; the inductor device may include a fourth electrically conductive path extending from a seventh terminal of the inductor device to an eighth terminal of the inductor device. The fourth electrically conductive path may be magnetically coupled to the third electrically conductive path. Each of the seventh terminal and the eighth terminal may be offset with respect to a second virtual axis extending through the fifth terminal and the sixth terminal. Further, the first electrically conductive path and the second electrically conductive path may be substantially magnetically isolated from the third electrically conductive path and the fourth electrically conductive path.

The inductor device may include insulator material disposed between the first electrically conductive path and the second electrically conductive path. The insulator material may be disposed between and envelope the first electrically conductive path and the second electrically conductive path.

The inductor device may include magnetic permeable material encapsulating the insulator material enveloping the first electrically conductive path and the second electrically conductive path.

Each of the terminals can be configured in any suitable shape. For example, the first terminal may be a first substantially rectangular surface mount pad; the second terminal may be a second substantially rectangular surface mount pad; the third terminal may be a third substantially rectangular surface mount pad; and the fourth terminal may be a fourth substantially rectangular surface mount pad.

The electrically conductive paths in the inductor device (such as a transformer device) may be fabricated in accordance with any suitable pattern. For example, the first electrically conductive path may be a first U-shaped winding of a transformer; the second electrically conductive path may be a second U-shaped winding of the transformer.

The virtual axis as previously discussed may be a first virtual axis; the first terminal and the third terminal may be disposed on a second virtual axis; the second virtual axis may be substantially perpendicular to the first virtual axis. The second terminal and the fourth terminal may be disposed on a third virtual axis, the third virtual axis may be substantially perpendicular to the first virtual axis. The second virtual axis may be parallel to the third virtual axis.

Yet further, the first terminal and the third terminal of the inductor device may be disposed adjacent to each other; the second terminal and the fourth terminal may be disposed adjacent to each other.

Note further that the third terminal and the fourth terminal may not be disposed along the virtual axis through the first terminal and the second terminal. Also, the third terminal and the fourth terminal may not be disposed in a space between the first terminal and the second terminal.

The electrically conductive paths in the inductor device can be set to any suitable value. For example, the first electrically conductive path (such as a primary inductive path) may be configured to have a lower resistivity than the second electrically conductive path (such as secondary inductive path).

The different inductor devices as discussed herein can be included in one or more different types of assemblies.

For example, a first assembly as discussed herein includes the inductor device as previously discussed. The first assembly may include a first circuit path electrically connecting the second terminal to the seventh terminal; the first assembly may include a second circuit path electrically connecting the first terminal to the fifth terminal.

A second circuit assembly as further discussed herein may include a first substrate. Any configuration of the inductor device as discussed herein may be disposed (such as mounted) on a surface of the first substrate. The second circuit assembly may further include circuitry mounted to the surface of the first substrate. Such circuitry may be disposed on the first substrate and reside between the first substrate and the inductor device. The circuitry may include a first transistor and a second transistor. The circuitry may further include a node coupling the first transistor in series with the second transistor. The node may be electrically coupled to the fourth terminal. The first transistor and second transistor may be configured to control a magnitude of current through the second electrically conductive path.

Another circuit assembly as further discussed herein may include a second substrate. the first circuit assembly as previously discussed may be electrically connected to the second substrate.

Another circuit assembly of the present disclosure may include multiple instances of the inductor device as discussed herein. For example, the circuit assembly may include a first instance of the inductor device coupled to a substrate; the circuit assembly may include a second instance of the inductor device coupled to the substrate. The substrate may provide connectivity of the third terminal of the first instance of the inductor device to the second terminal of the second instance of the inductor device.

Yet another circuit assembly of the present disclosure may include the inductor device as discussed herein coupled to a substrate; the substrate may provide electrical connectivity between the second terminal and the seventh terminal.

The present disclosure further includes a method of fabricating an inductor device. The method may include fabricating a first electrically conductive path to extend from a first terminal of an inductor device to a second terminal of the inductor device. The method may further include fabricating a second electrically conductive path to extend from a third terminal of the inductor device to a fourth terminal of the inductor device, the second electrically conductive path fabricated to be magnetically coupled to the first electrically conductive path. Each of the third terminal and the fourth terminal may be fabricated to be offset with respect to a virtual axis extending through the first terminal and the second terminal.

These and other more specific examples are disclosed in more detail below.

Note that any of the resources (such as a fabricator) implemented in the system as discussed herein can include one or more computerized devices, controllers, mobile communication devices, handheld or laptop computers, or the like to carry out and/or support any or all of the method operations disclosed herein. In other words, one or more computerized devices or processors can be programmed and/or configured to operate as explained herein to carry out the different implementations as described herein.

Yet other implementations herein include software programs to perform the steps and operations summarized above and disclosed in detail below. One such implementation comprises a computer program product including a non-transitory computer-readable storage medium (i.e., any computer readable hardware storage medium) on which software instructions are encoded for subsequent execution. The instructions, when executed in a computerized device (hardware) having a processor, program and/or cause the processor (hardware) to perform the operations disclosed herein. Such arrangements are typically provided as software, code, instructions, and/or other data (e.g., data structures) arranged or encoded on a non-transitory computer readable storage medium such as an optical medium (e.g., CD-ROM), floppy disk, hard disk, memory stick, memory device, etc., or other a medium such as firmware in one or more ROM, RAM, PROM, etc., or as an Application Specific Integrated Circuit (ASIC), etc. The software or firmware or other such configurations can be installed onto a computerized device to cause the computerized device to perform the techniques explained herein.

Accordingly, implementations herein are directed to a method, system, computer program product, etc., that supports operations as discussed herein.

One example in this disclosure includes a fabricator such as including computer readable storage medium and/or system having instructions stored thereon to fabricate an inductor device. The instructions, when executed by computer processor hardware, cause the computer processor hardware (such as one or more co-located or disparately located processor devices or hardware) to: fabricate a first electrically conductive path to extend from a first terminal of an inductor device to a second terminal of the inductor device; fabricate a second electrically conductive path to extend from a third terminal of the inductor device to a fourth terminal of the inductor device, the second electrically conductive path being magnetically coupled to the first electrically conductive path; and each of the third terminal and the fourth terminal fabricated be offset with respect to a virtual axis extending through the first terminal and the second terminal.

The ordering of the steps above has been added for clarity sake. Note that any of the processing steps as discussed herein can be performed in any suitable order.

Other examples of the present disclosure include software programs and/or respective hardware to perform any of the method operations summarized above and disclosed in detail below.

It is to be understood that the system, method, apparatus, instructions on computer readable storage media, etc., as discussed herein also can be embodied strictly as a software program, firmware, as a hybrid of software, hardware and/or firmware, or as hardware alone such as within a processor (hardware or software), or within an operating system or a within a software application.

Note further that although implementations as discussed herein are applicable to switching power supplies, the concepts disclosed herein may be advantageously applied to any other suitable topologies.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of implementations herein (BRIEF DESCRIPTION) purposefully does not specify every implementation and/or incrementally novel aspect of the present disclosure or claimed invention(s). Instead, this brief description only presents general implementations and corresponding points of novelty over conventional techniques. For additional details and/or possible perspectives (permutations) of the invention(s), the reader is directed to the Detailed Description section (which is a summary of implementations) and corresponding figures of the present disclosure as further discussed below.

BRIEF DESCRIPTION OF THE DRAWINGS

FIG. 1A is an example diagram illustrating a three-dimensional (see-through) view of an outer structure associated with an inductor device including multiple inductive paths.

FIG. 1B is an example first side view diagram of internal components of the inductor device in FIG. 1A.

FIG. 1C is an example second side view diagram of internal components of the inductor device in FIG. 1A.

FIG. 1D is an example bottom view diagram and multiple virtual axes associated with the inductor device in FIG. 1A.

FIG. 1E is an example bottom view diagram and multiple virtual axes associated with the inductor device in FIG. 1A.

FIG. 1F is an example cutaway cross-sectional view diagram of electrically conductive paths in an inductor device.

FIG. 2A is an example diagram illustrating a three-dimensional (see-through) outer view of a structure associated with an inductor device including multiple inductive paths.

FIG. 2B is an example first side view diagram of internal components of the inductor device in FIG. 2A.

FIG. 2C is an example second side view diagram of internal components of the inductor device in FIG. 2A.

FIG. 2D is an example bottom view diagram of the inductor device in FIG. 2A.

FIG. 5A is an example diagram illustrating an assembly including an inductor device disposed on a respective substrate.

FIG. 5B is an example diagram illustrating an assembly including multiple instance of inductor devices disposed on a respective substrate.

FIG. 7A is an example diagram illustrating a three-dimensional (see-through) view of an outer structure associated with an inductor device including multiple pairings of electrically conductive paths (inductive paths).

FIG. 7B is an example first side view diagram of internal components of the inductor device in FIG. 7A.

FIG. 7C is an example second side view diagram of internal components of the inductor device in FIG. 7A.

FIG. 7D is an example bottom view diagram of the inductor device in FIG. 7A.

FIG. 8A is an example side view diagram of internal components of the inductor device in FIG. 7A.

FIG. 8B is an example side view diagram of internal components of the inductor device in FIG. 7A.

FIG. 8C is an example top view cutaway diagram of the inductor device in FIG. 7A including magnetic flux paths.

Figure 3:
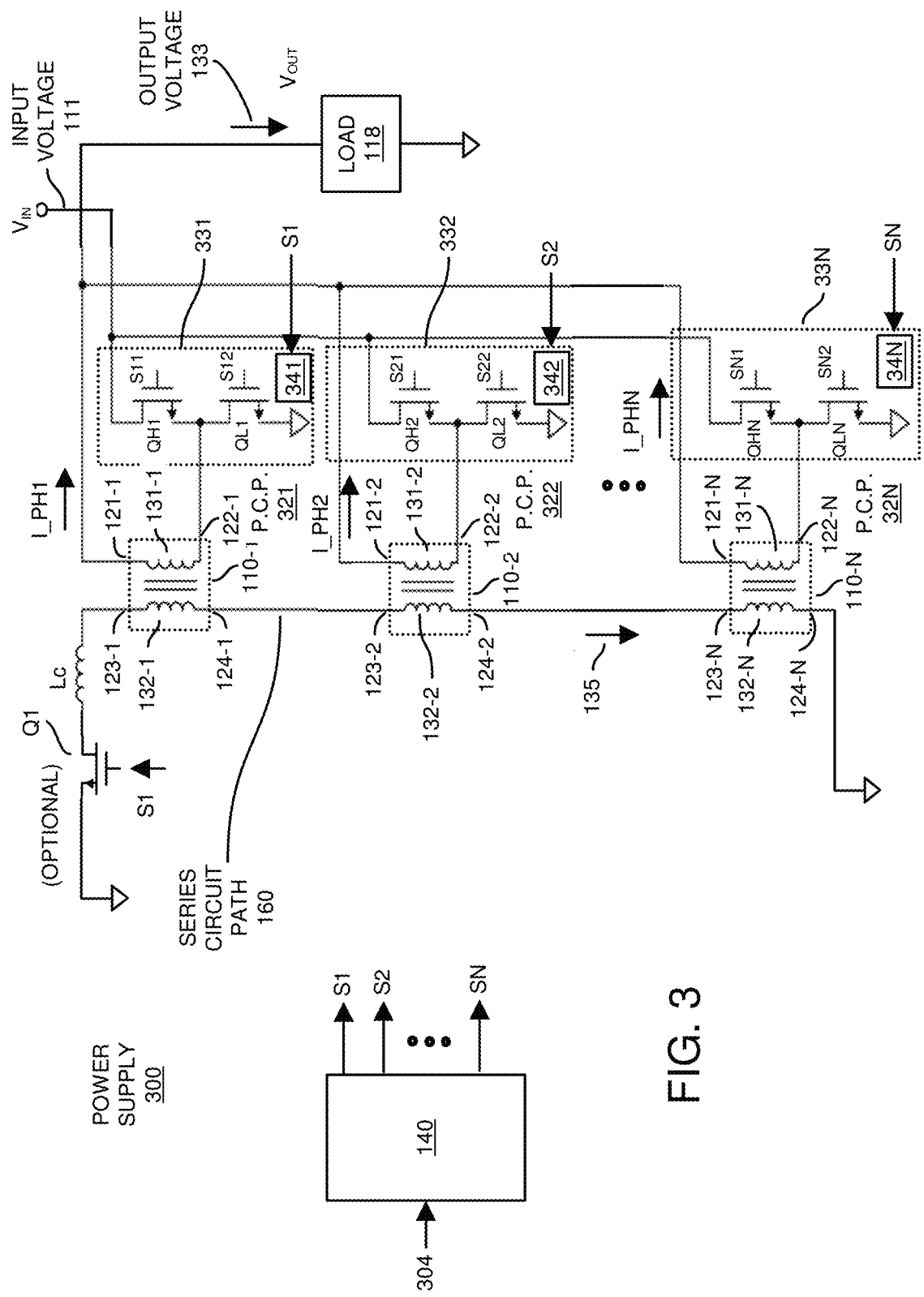
FIG. 3 is an example diagram illustrating implementation of a power supply including multiple inductor devices.

The foregoing and other objects, features, and advantages of implementations herein will be apparent from the following more particular description herein, as illustrated in the accompanying drawings in which like reference characters refer to the same parts throughout the different views. The drawings are not necessarily to scale, with emphasis instead being placed upon illustrating the implementations, principles, concepts, etc.

DETAILED DESCRIPTION

Now, with reference to the drawings, FIG. 1A is an example diagram illustrating a three-dimensional (see-through) view of an outer structure associated with an inductor device including multiple inductive paths.

As shown in FIG. 1A, the inductor device 110 includes multiple terminals 121, 122, 123, and 124 (such as surface pads, pins, connectors, etc.). As further discussed herein, the multiple terminals 121, 122, 123, 124 provide connectivity of the inductor device 110 to a respective substrate and/or assembly.

The inductor device 110 can be any suitable type of device. For example, the inductor device 110 can be configured as a surface mount transformer device uniquely designed to support functions as discussed herein. For example, each of the first terminal 121, the second terminal 122, the third terminal 123, and the fourth terminal 124, include a respective exposed surface area to connect the terminals of the inductor device 110 to a circuit board or other object. Surfaces of the first terminal 121, the second terminal 122, the third terminal 123, and the fourth terminal 124 can be configured to reside in a common plane of the inductor device 110.

Additional views of the inductor device 110 in FIGS. 1B, 1C, 1D, and 1E illustrate the inner components associated with the inductor device 110.

FIG. 1B is an example first side view diagram of internal components of the inductor device in FIG. 1A.

As shown in FIG. 1B and other views, the inductor device 110 includes multiple electrically conductive paths such as electrically conductive paths 131 and 132. The electrically conductive path 131 (inductive path) extends through the terminal 121 and the terminal 122 (such as surface pads, connectors, etc.). The electrically conductive path 132 (inductive path) extends through the terminal 123 and terminal 124.

Note that the terminal 121 is electrically isolated from the terminal 123 although it resides next to it. The terminal 122 is electrically isolated from the terminal 124 although it resides next to it.

Presence and proximity of the electrically conductive paths 131 and 132 to each other in the magnetic permeable material 115 of the inductor device 110 as shown in the different views transforms the electrically conductive path 131 into a first inductive path and transforms the second wireless communication protocol 132 into a second inductive path.

As shown in cutaway view B' of FIG. 1F, note further that the inductor device 110 may include insulator material 116 disposed between and/or surrounding, enveloping, etc., a combination (pair) of the spaced apart first electrically conductive path 131 and the second electrically conductive path 132 along its full length between the respective terminals. The magnetic permeable material 115 envelopes the combination of electrically conductive paths 131, 132, and the insulator material 116. The insulator material 116 may be disposed between first electrically conductive path 131 and the second electrically conductive path 132; the insulator material 116 may envelope the first electrically conductive path 131 and the second electrically conductive path 132; the magnetic permeable material 115 may encapsulate the insulator material 116 enveloping the first electrically conductive path 131 and the second electrically conductive 132.

The electrically conductive paths in the inductor device 110 are spaced apart so as not to contact each other and can be fabricated using any suitable electrically conductive material. For example, the electrically conductive paths can be fabricated from metal (such as copper, tin, lead, gold, silver, and platinum, aluminum, iron, etc.), a metal alloy (such as a metallic substance made by mixing and fusing two or more metals, or a metal and a nonmetal, etc.).

As previously discussed, the inductor device 110 may further include a core structure at least partially fabricated from or including magnetically permeable material and standoffs. In such an instance, the spaced apart first electrically conductive path 131 and the second electrically conductive 132 path extend through the magnetic permeable material 115 from one terminal at the first end 109-1 and a second terminal at the second end 109-2.

As further shown, the inductor device 110 can be fabricated in accordance with any suitable pattern. For example, the first electrically conductive path 131 (primary inductive path) can be configured as a first U-shaped winding (such as a single turn) extending from the terminal 121 to the terminal 122. The second electrically conductive path 132 (such as secondary inductive path) can be configured as a second U-shaped winding (such as a single turn) extending from the terminal 123 to the terminal 124. As previously discussed, the second electrically conductive path 132 is magnetically coupled to the first electrically conductive path 131. Thus, the inductor device 110 is a transformer.

Note further that each of the electrically conductive paths in the inductor device 110 can include multiple turns if desired, the windings being magnetically coupled to each other.

The electrically conductive paths in the inductor device 110 can have any suitable resistance value. For example, the first electrically conductive path 131 may be configured to have a lower resistivity than the second electrically conductive path 132 such as because the electrically conductive path 131 is fabricated from a thicker and/or wider strip of material than a strip of material used to fabricate the electrically conductive path 132.

As further shown, the inductor device 110 can be configured to include a cavity 120 disposed in its core structure between terminals and corresponding standoffs. For example, core structure of the inductor device 110 can be configured to include magnetic permeable material 115 and standoffs 119-1 and 119-2. As its name suggests, standoffs 119-1 and 119-2 provide a spacing (such as associated with cavity 120) of a bottom surface of the inductor device 110 with respect to a circuit board to which the inductor device 110 is attached. See further FIGS. as discussed herein. Note that the standoffs can be fabricated from magnetic permeable material 115 or other suitable insulator material such as plastic. Thus, the cavity 120 can be configured as a void disposed on a bottom side of the inductor device 110. The cavity 120 enables airflow as well as provides space (open volume) in which other circuitry can occupy as further discussed herein.

FIG. 1C is an example second side view diagram of an inductor device in FIG. 1A.

This side view diagram of the inductor device 110 illustrates connectivity of a first terminal end of the electrically conductive path 131 to the terminal 121 and connectivity of a first terminal end of the electrically conductive path 132 to the terminal 123. At an opposite end, the inductor device 110 includes connectivity of a second terminal end of the electrically conductive path 131 to the terminal 122 and connectivity of a second terminal end of the electrically conductive path 132 to the terminal 124.

Further, the side view diagram of FIG. 1C illustrates the width of the inductor device 110 as being Z1, which can be any suitable value.

FIG. 1D is an example bottom view diagram of an inductor device in FIG. 1A.

As shown, the inductor device 110 includes a bottom surface as shown via the bottom view of the inductor device 110 in FIG. 1D. The first terminal 121, the second terminal 122, the third terminal 123, and the fourth terminal 124 on the bottom surface of the inductor device 110 can be implemented as metallic pads, pins, etc.

In this example, a center C11 of the first terminal 121 and a center C12 of the second terminal 122 are disposed on the virtual axis #1. A center C13 of the third terminal 123 and a center of the fourth terminal 124 are disposed on the virtual axis #2. The virtual axis #2 is nonparallel with respect to the virtual axis #1. As previously discussed, the third terminal 123 is offset (by a desired distance) with respect to the virtual axis #1; the fourth terminal 124 is offset (by a desired distance) with respect to the virtual axis #1 as well. A surface region of the terminal 123 does not overlap the axis #1; a surface region of the terminal 124 does not overlap the axis #1; a surface region of the terminal 121 does not overlap the axis #2; a surface region of the terminal 122 does not overlap the axis #2.

Thus, the terminal 123 and the terminal 124 may be disposed on opposite sides of the virtual axis #1. The virtual axis #2 extends through the center C13 of the third terminal 123 and a center C14 of the fourth terminal 124 and crosses the virtual axis #1.

Yet further, the first terminal 121 and the third terminal 123 of the inductor device 110 are disposed adjacent to each other; the second terminal 122 and the fourth terminal 124 are disposed adjacent to each other.

Each of the terminals can be configured in any suitable shape. For example, the first terminal 121 may be a first substantially rectangular surface mount pad; the second terminal 122 may be a second substantially rectangular surface mount pad; the third terminal 123 may be a third substantially rectangular surface mount pad; and the fourth terminal 124 may be a fourth substantially rectangular surface mount pad.

FIG. 1E is an example bottom view diagram of an inductor device in FIG. 1A.

In this example, as a further illustration, the first terminal 121 and the second terminal 122 lie on the axis #1.

Additionally, the first terminal 121 and the third terminal 123 are disposed on virtual axis 195-1; the virtual axis 195-1 is substantially perpendicular to the first virtual axis #1. The second terminal 122 and the fourth terminal 124 are disposed on virtual axis 195-2, the virtual axis 195-2 is substantially perpendicular to the virtual axis #1. Axis 195-1 extends through center C11 of terminal 121 and center C13 of terminal 123. Axis 195-2 extends through center C12 of terminal 122 and center C14 of terminal 124.

The virtual axis 195-1 is substantially parallel to the virtual axis 195-2.

Thus, the third terminal 123 and the fourth terminal 124 may not be disposed along the virtual axis #1 through the first terminal 121 and the second terminal 122. The third terminal 123 and the fourth terminal 124 may not be disposed in a space between the first terminal 121 and the second terminal 122.

FIG. 2A is an example diagram illustrating a three-dimensional (see-through) view of an outer structure associated with an inductor device including multiple inductive paths.

As shown in FIG. 2A, the inductor device 210 includes multiple terminals 221, 222, 223, and 224 (such as surface pads, connectors, etc.). As further discussed herein, the multiple terminals 221, 222, 223, 224 provide connectivity of the inductor device 210 to a respective substrate and/or assembly.

The inductor device 210 can be any suitable type of device. For example, the inductor device 210 can be configured as a surface mount transformer device uniquely designed to support functions as discussed herein. For example, the first terminal 221, the second terminal 222, the third terminal 223, and the fourth terminal 224, include exposed surface areas to connect to a circuit board or other object. Surfaces of the first terminal 221, the second terminal 222, the third terminal 223, and the fourth terminal 224 reside in a common plane of the inductor device 210.

Additional views of the inductor device 210 in FIGS. 2B, 2C, and 2D, illustrate the inner components associated with the inductor device 210.

FIG. 2B is an example first side view diagram of internal components of the inductor device in FIG. 2A.

As shown in FIG. 2B, the inductor device 210 includes multiple electrically conductive paths such as electrically conductive paths 231 and 232. The electrically conductive path 231 extends between the terminal 221 and the terminal 222 (such as surface pads, connectors, etc.). The electrically conductive path 232 extends between the terminal 223 and terminal 224.

Note that the terminal 221 is electrically isolated from the terminal 223 although it resides next to it. The terminal 222 is electrically isolated from the terminal 224 although it resides next to it.

Presence and proximity of the electrically conductive paths 231 and 232 to each other in the core magnetic permeable material 115 of the inductor device 210 as shown in the different views transforms the electrically conductive path 231 into a first inductive path and transforms the second wireless communication protocol 232 into a second inductive path.

In a similar manner as previously discussed, the inductor device 210 may include insulator material 116 disposed between and/or surrounding, enveloping a combination of the first electrically conductive path 231 and the second electrically conductive path 232 along its full length between or partial length between respective terminals. In any suitable manner as previously discussed with respect to inductor device 210, the magnetic permeable material 115 of inductor device 210 envelopes the combination of electrically conductive paths 231, 232, and the insulator material 116.

The electrically conductive paths in the inductor device 210 can be fabricated using any suitable material. For example, the electrically conductive paths can be fabricated from metal (such as copper, tin, lead, gold, silver, and platinum, aluminum, iron, etc.), a metal alloy (such as a metallic substance made by mixing and fusing two or more metals, or a metal and a nonmetal, etc.).

As previously discussed, the inductor device 210 may further include a core structure fabricated from magnetically permeable material. In such an instance, the first electrically conductive path 231 and the second electrically conductive 232 path extend through the magnetic permeable material 115 from first end 209-1 to second end 209-2.

As further shown, the inductor device 210 can be fabricated in accordance with any suitable pattern. For example, the first electrically conductive path 231 is a first U-shaped winding (such as a single turn) extending from the terminal 221 to the terminal 222. The second electrically conductive path 232 is a second U-shaped winding (such as a single turn) extending from the terminal 223 to the terminal 224.

As previously discussed, the second electrically conductive path 232 is magnetically coupled to the first electrically conductive path 231. Thus, the inductor device 210 is a transformer.

Note further that each of the electrically conductive paths in the inductor device 210 can include multiple turns if desired.

The electrically conductive paths in the inductor device 210 can have any suitable resistance value. For example, the first electrically conductive path 231 can be configured to have a lower resistivity than the second electrically conductive path 232 such as because the electrically conductive path 231 is fabricated from a thicker and/or wider strip of material than a strip of material used to fabricate the electrically conductive path 232.

As further shown, a bottom-side of the inductor device 210 can be configured to include a cavity 220 disposed in its core structure such as between terminals and corresponding standoffs. For example, the core structure of the inductor device 210 can be configured to magnetic permeable material 215 and include standoffs 219-1 and 219-2. As its name suggests, standoffs 219-1 and 219-2 provide a spacing (such as associated with cavity 220) of a bottom surface of the inductor device 110 with respect to a circuit board to which the inductor device 210 is attached. See further FIGS. as discussed herein. Note that the standoffs 219-1 and 219-2 can be fabricated from magnetic permeable material 115 or other suitable insulator material such as plastic. Thus, the cavity 220 is a void disposed between the first axial end 209-1 of the inductor device 210 and the second axial end 209-2 of the inductor device 210.

FIG. 2C is an example second side view diagram of internal components of an inductor device in FIG. 2A.

The side view diagram of the inductor device 210 illustrates connectivity of a first terminal end of the electrically conductive path 231 to the terminal 221. The opposite end of the electrically conductive path 232 is connected to the terminal 222.

The side view diagram of the inductor device 210 also illustrates connectivity of a first terminal end of the electrically conductive path 232 to the terminal 223. The opposite end of the electrically conductive path 232 is connected to the terminal 224.

Further, the side view diagram of FIG. 2C illustrates the width of the inductor device 210 as being Z2, which can be any suitable value.

FIG. 2D is an example bottom view diagram of internal components of an inductor device in FIG. 2A.

As shown, the inductor device 210 includes a bottom surface as shown via the bottom view of FIG. 2D. The first terminal 221, the second terminal 222, the third terminal 223, and the fourth terminal 224 on the bottom surface of the inductor device 210 can be implemented as metallic pads.

In this example, the first terminal 221 and the second terminal 222 are disposed on the virtual axis #21. The third terminal 223 and the fourth terminal 224 are disposed on the axis #22. The axis #22 is parallel with respect to the axis #21.

As previously discussed, the third terminal 223 is offset (by a desired distance) with respect to the axis #21; the fourth terminal 224 is offset (by a desired distance) with respect to the axis #21 as well.

The virtual axis #22 extends between the third terminal 223 and the fourth terminal 224 and does not cross the virtual axis #1.

Yet further, the first terminal 221 and the third terminal 223 of the inductor device 210 are disposed adjacent to each other; the second terminal 222 and the fourth terminal 224 are disposed adjacent to each other.

Note that the inductor device 210 as further discussed herein can be used as a substitute with respect to the inductor device 110.

Thus, the terminal 223 and the terminal 224 are on a same side of the virtual axis #21.

Each of the terminals can be configured to be any suitable shape. For example, the first terminal 221 may be a first substantially rectangular surface mount pad; the second terminal 222 may be a second substantially rectangular surface mount pad; the third terminal 223 may be a third substantially rectangular surface mount pad; and the fourth terminal 224 may be a fourth substantially rectangular surface mount pad.

FIG. 3 is an example diagram illustrating implementation of a power supply including multiple inductor devices (transformers).

In this example, each of the power converter phases in the power supply 300 includes a pair of switches (such as high side switch circuitry and low side switch circuitry) and one or more windings (inductive paths) to contribute to generation of the output voltage 133 powering load 118. Note each instant of the inductor device 110 in FIG. 3 can be replaced with an instance of inductor device 210 if desired.

For example, the power converter phase 321 includes inductor device 110-1 (such as including electrically conductive path 131-1 and electrically conductive path 132-1), switch QH1 (such as high side switch circuitry) controlled by signal S11, and switch QL1 (such as low side switch circuitry) controlled by signal S12. Switch QH1 is connected in series with switch QL1 between the input voltage 111 and a reference potential (reference voltage). For example, the drain of switch QH1 receives the input voltage 111; the source of QH1 is connected to the drain of switch QL1 and contributes to producing the output voltage 133; the source of QL1 is connected to the reference potential.

The power converter phase 322 includes inductor device 110-2 (such as including electrically conductive path 131-2 and electrically conductive path 132-2), switch QH2 (such as high side switch circuitry) controlled by signal S21 and switch QL2 (such as low side switch circuitry) controlled by signal S22. Switch QH2 is connected in series with switch QL2 between the input voltage 111 and a reference potential (reference voltage). For example, the drain of switch QH2 receives the input voltage 111; the source of QH2 is connected to the drain of switch QL2 and contributes to producing the output voltage 133; the source of QL2 is connected to the reference potential.

The power converter phase 32N (nth phase) includes inductor device 110-N (such as including inductive path 131-N and inductive path 132-N), switch QHN (such as high side switch circuitry) controlled by signal SN1 and switch QLN (such as low side switch circuitry) controlled by signal SN2. Switch QHN is connected in series with switch QLN between the input voltage 111 and a reference potential (reference voltage). For example, the drain of switch QHN receives the input voltage 111; the source of QHN is connected to the drain of switch QN1 and contributes to producing the output voltage 133; the source of QN1 is connected to the reference potential.

Thus, the power converter phase 321 includes inductor device 110-1 (first transformer or first instance of inductor device 110) including electrically conductive path 131-1 magnetically (inductively) coupled to the electrically conductive path 132-1; power converter phase 322 includes inductor device 110-2 (second transformer or second instance of inductor device 110) including electrically conductive path 131-2 magnetically (inductively) coupled to the electrically conductive path 132-2; power converter phase 32N includes inductor device 110-N (Nth transformer or Nth instance of inductor device 110) including electrically conductive path 131-N magnetically (inductively) coupled to the electrically conductive path 132-N. Network can be any suitable value.

As further shown, the controller 140 generates the control signals (S1, S2, . . . , SN) depending on a magnitude of the output voltage 133 with respect to a desired setpoint reference voltage 304 as in buck converter or other suitable technology. The controller 140 controls the output voltage 133 to be substantially equal to a setpoint reference voltage. Details are further discussed below Each phase includes driver circuitry. For example, power converter phase 321 includes switch driver circuitry 341; power converter phase 322 includes switch driver circuitry 342; . . . ; power converter phase 32N includes switch driver circuitry 34N.

Driver circuitry 341 receives control signal 51 generated by the controller 140 and, based on control signal 51, produces corresponding signals S11 controlling switch QH1 and control signal S12 controlling switch QL1. The circuitry 331 associated with the power converter phase 321 includes multiple components such as switch QH1, switch QL1, driver circuitry 341, etc.

Driver circuitry 342 receives control signal S2 generated by the controller 140 and, based on control signal S2, produces corresponding signals S21 controlling switch QH2 and control signal S22 controlling switch QL1. The circuitry 332 associated with the power converter phase 322 includes multiple components such as switch QH2, switch QL2, driver circuitry 342, etc.

Driver circuitry 34N receives control signal SN generated by the controller 140 and, based on control signal SN, produces corresponding signals SN1 controlling switch QHN and control signal SN2 controlling switch QLN. The circuitry 33N associated with the power converter phase 32N includes multiple components such as switch QHN, switch QLN, driver circuitry 34N, etc.

In general, as in a buck converter topology, activation of corresponding high side switch circuitry in a respective power converter phase increases a magnitude of the output voltage 133; activation of the low side switch circuitry results in decreased current to the load from the energy stored in the respective primary side winding (such as electrically conductive path 131-1, 131-2, . . . , 131-N).

The electrically conductive paths 132-1, 132-2, . . . 132-N associated with the inductor devices 110, are windings of the multiple power converter phases connected in series in the series circuit path 160. As previously discussed, each of the multiple power converter phases 321, 322, 32N, includes a primary winding (such as electrically conductive path 131-1, 131-2, . . . , 131-N) and a secondary winding (such as electrically conductive path 132-1, 132-2, . . . , 132-N). In such an implementation, each of the electrically conductive paths 131-1, 131-2, . . . , 131-N, of the multiple power converter phases produces, based on control signals from the controller 140, respective phase output current (or voltage) contributing to generation of an output voltage 133 that powers a load 118. For example, the electrically conductive path 131-1 produces/outputs current I_PH1; winding 131-2 produces/outputs current I_PH2; . . . ; winding 131-N produces/outputs current I_PHN.

During operation, the controller 140 controls the high side switch circuitry and the low side switch circuitry to be ON at different times. The high side switch circuitry and low side switch circuitry are never activated at the same time. There is a dead time between activating the high side switch circuitry and low side switch circuitry.

Figure 4:
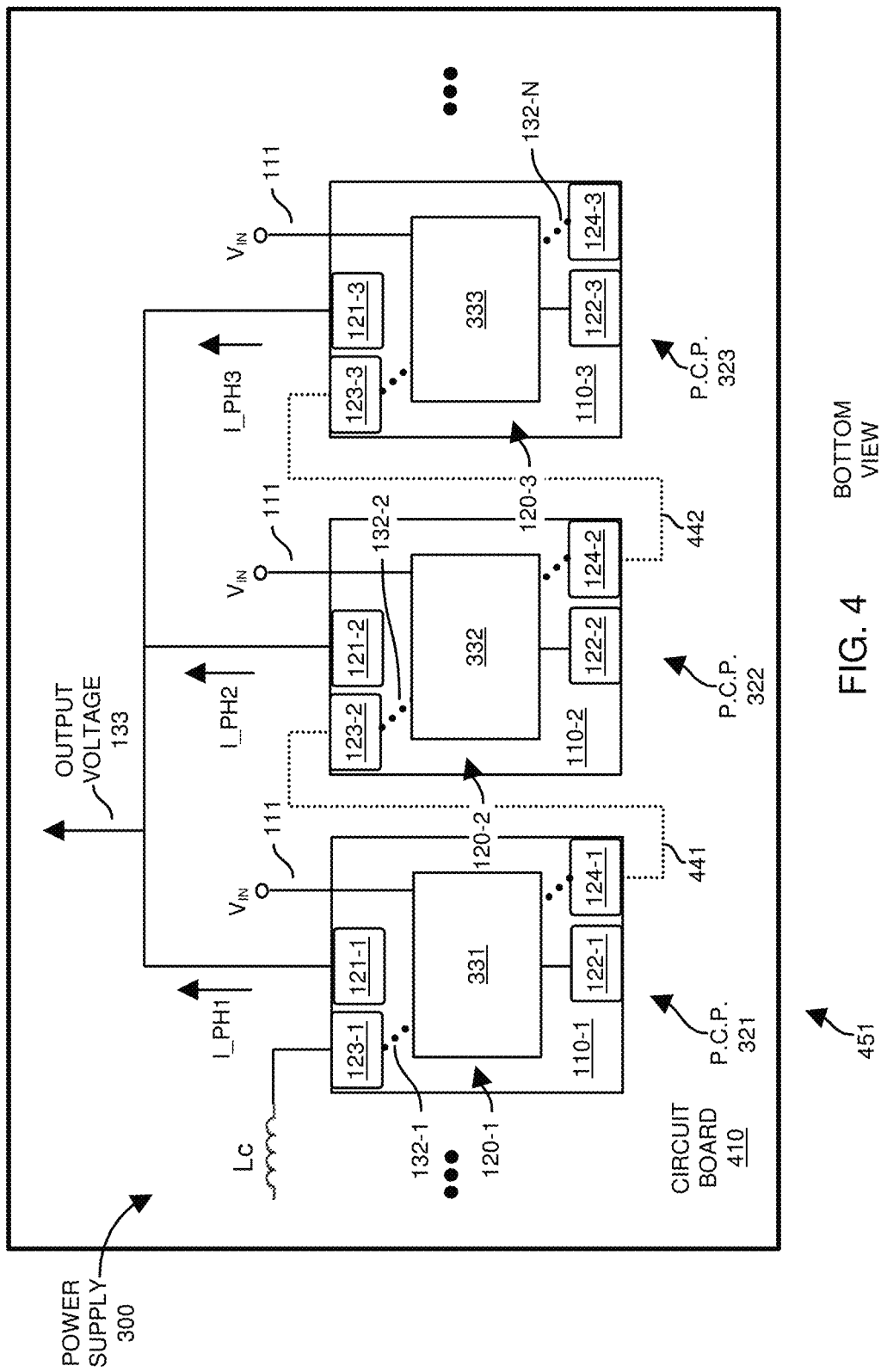
FIG. 4 is an example diagram illustrating a circuit board assembly including multiple inductor devices.

FIG. 4 is an example diagram illustrating a circuit board including multiple inductor devices.

In this implementation, the bottom view of the circuit board 410 illustrates connectivity of the components associated with the power supply 300 fabricated on the circuit board 410.

As shown in this view, the circuitry 331 is disposed in the cavity 120-1 between the inductor device 110-1 and the corresponding circuit board 410; the circuitry 332 is disposed in the cavity 120-2 between the inductor device 110-2 and the corresponding circuit board 410; . . . ; the circuitry 33N is disposed in the cavity 120-N between the inductor device 110-N and the corresponding circuit board 410.

In this example, the windings of the inductor devices 110-1, 110-2, . . . , 110-N are connected in series in the respective circuit path (such as circuit path 160) disposed on the circuit board 410.

For example, the inductor $L_C$ is electrically coupled to the terminal 123-1 of the inductor device 110-1; the electrically conductive path 132-1 associated with the inductor device 110-1 extends internally between the terminal 123-1 and terminal 124-1 in a manner as previously discussed; circuit path 441 (electrically conductive path such as a metallic trace or other suitable entity) on circuit board 410 provides connectivity of the terminal 124-1 associated with the inductor device 110-1 to the terminal 123-2 of the inductor device 110-2; the electrically conductive path 132-2 associated with the inductor device 120-2 is internally connected between the terminal 123-2 and terminal 124-2 in a manner as previously discussed; circuit path 442 (electrically conductive path such as a metallic trace or other suitable entity) on circuit board 410 provides connectivity of the terminal 124-2 associated with the inductor device 110-2 to the terminal 123-3 of the inductor device 110-3; the electrically conductive path 132-3 associated with the inductor device 120-3 is connected between the terminal 123-3 and terminal 124-3 in a manner as previously discussed; and so on.

The collective output current generated by each of the power converter phases produces the respective output voltage 133. For example, power converter phase 321 produces respective output current I_PH1; power converter phase 322 produces respective output current I_PH2; power converter phase 323 produces respective output current I_PH3; and so on.

In this manner, based on the attributes of the inductor devices (such as pin layout of terminals), the inductor devices support advantageous daisy chaining to produce the series circuit path 160 of the power supply 300. The implementation of a respective cavity associated with each inductor device enables each power converter phase to be small in size as well as allows the driver circuitry to be located in close proximity to the inductive paths associated with the multiple power converter phases.

FIG. 5A is an example diagram illustrating an assembly including an inductor device disposed on a respective substrate.

In this example implementation, the assembly 511 includes the inductor device 110-1 (such as a first instance of inductor device 110) disposed on the substrate 410. In a manner as previously discussed, the circuitry 331 is disposed in a respective cavity 120 between the substrate 410 in the inductor device 110-1.

FIG. 5B is an example diagram illustrating assembly including an inductor device disposed on a respective substrate.

In this example implementation, the assembly 451 includes one or more inductor devices such as a first instance of the inductor device 110-1, second instance of the inductor device 110-2, third instance of the inductor device 110-3, etc., disposed on the substrate 410.

In a manner as previously discussed, respective circuitry 331, 332, 333, etc., is disposed in corresponding cavities 120 between the substrate 410 and an instance of the inductor device, resulting in a small and efficient form factor.

Figure 6:
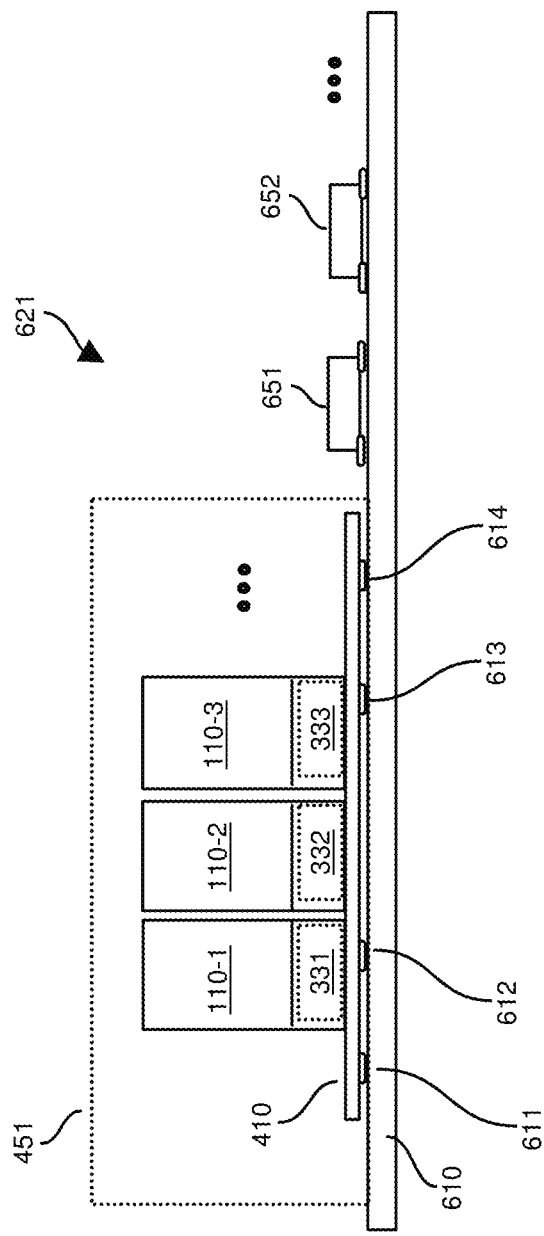
FIG. 6 is an example diagram illustrating a primary circuit assembly including multiple inductor devices affixed to a respective substrate of a secondary circuit assembly.

FIG. 6 is an example diagram illustrating a circuit assembly including multiple inductor devices affixed to a respective substrate.

In this example, the assembly 621 is fabricated to include assembly 451 (from FIG. 5B) as well as other components. For example, the assembly 511 is electrically connected to the substrate 610 via connectivity 611, connectivity 612, connectivity 613, and connectivity 614 (such as solder joints, surface pads, connectors, etc.). As further shown, additional components such as device 651, device 652, etc., are affixed to the substrate 610.

FIG. 7A is an example diagram illustrating a three-dimensional (see-through) view of an outer structure associated with an inductor device including multiple pairings of electrically conductive paths (inductive paths).

As shown in FIG. 7A, the inductor device 410 includes multiple terminals 421, 422, 423, 424, 425, 426, 427, and 428 (such as surface pads, connectors, etc.). As further discussed herein, the multiple terminals 421, 422, 423, 424, 425, 426, 427, and 428 provide connectivity of the inductor device 410 to a respective substrate and/or assembly. In general, the inductor device 410 combines two instances of inductor devices 110. The inductor device 410 can include any number of multiple inductor devices.

The inductor device 410 can be any suitable type of device. For example, the inductor device 410 can be configured as a surface mount transformer device uniquely designed to support functions as discussed herein. For example, the terminals 421, 422, 423, 424, 425, 426, 427, and 428 include respective exposed surface areas to connect to a circuit board or other object. Surfaces of the terminals 421, 422, 423, 424, 425, 426, 427, and 428 can be configured to reside in a common plane of the inductor device 410.

Additional views of the inductor device 410 in FIGS. 7B, 7C, and 7D, illustrate the inner components and connectivity associated with the inductor device 410.

FIG. 7B is an example first side view diagram of internal components of the inductor device in FIG. 7A.

The inductor device 410 includes multiple electrically conductive paths such as electrically conductive paths 431-1, 432-1, 431-2 and 432-2.

The electrically conductive path 431-1 extends between the terminal 421 and the terminal 422 (such as surface pads, connectors, etc.). The electrically conductive path 432-1 extends between the terminal 423 and terminal 424. The electrically conductive path 432-1 extends between the terminal 425 and the terminal 426 (such as surface pads, connectors, etc.). The electrically conductive path 432-2 extends between the terminal 427 and terminal 428.

In any suitable manner as previously discussed, presence and proximity of the electrically conductive paths 431-1 and 432-2 to each other in the core magnetic permeable material 115 of the inductor device 410 as shown in the different views transforms the electrically conductive path 431-1 into a first inductive path and transforms the second electrically conductive path 432-1 into a second inductive path. In a similar manner, presence and proximity of the electrically conductive paths 431-2 and 432-2 to each other in the core magnetic permeable material 115 of the inductor device 410 as shown in the different views transforms the electrically conductive path 431-2 into a third inductive path and transforms the electrically conductive path 432-2 into a fourth inductive path.

As previously discussed, note further that the inductor device 410 may include insulator material 116 disposed between and/or surrounding, enveloping a combination of the first electrically conductive path 431-1 and the second electrically conductive path 432-1 along part or all of its full length between respective terminals. The inductor device 410 may include insulator material 116 disposed between and/or surrounding, enveloping a combination of the electrically conductive path 431-2 and the electrically conductive path 432-2 along part or all of its full length between respective terminals.

The electrically conductive paths in the inductor device 110 can be fabricated using any suitable material. For example, the electrically conductive paths can be fabricated from metal (such as copper, tin, lead, gold, silver, and platinum, aluminum, iron, etc.), a metal alloy (such as a metallic substance made by mixing and fusing two or more metals, or a metal and a nonmetal, etc.).

Further, as previously discussed, the inductor device 410 may include a core structure comprising magnetically permeable material 115 as well as one or more standoffs 419-1 and 419-2. In such an instance, the electrically conductive path 431-1 and the electrically conductive 432-1 path extend through the magnetic permeable material 115 and/or standoffs.

As further shown, the electrically conductive paths in the inductor device 410 can be fabricated in accordance with any suitable pattern. For example, each of the electrically conductive paths can be U-shaped winding (such as a single turn) extending from a first terminal to a second terminal. Each pair of electrically conductive paths 431-1/432-1 and 431-2/432-2 is magnetically coupled to each other. Thus, the inductor device 410 includes multiple transformers.

The inductor device can be any length and include any number of transformers.

Note further that each of the electrically conductive paths in the inductor device 410 can include multiple turns if desired.

The electrically conductive paths in the inductor device 110 can have any suitable resistance value. For example, the primary electrically conductive path (such as 431) of the respective of a pair of electrically conductive paths can be configured to have a lower resistivity than the secondary electrically conductive path (such as 432) because the electrically conductive path 431 is fabricated from a thicker and/or wider strip of material than a strip of material used to fabricate the electrically conductive path 432.

As further shown, the inductor device 410 can be configured to include a cavity 420 (spectrum access system void) disposed in its core structure. In a similar manner as previously discussed, a bottom-side of the inductor device 410 can be configured to include a cavity 420 disposed in its core structure of the inductor device 410 such as between terminals and corresponding standoffs. For example, the inductor device 410 can be configured to include standoffs 419-1 and 419-2. As its name suggests, standoffs 419-1 and 419-2 provide a spacing (such as associated with cavity 420) of a bottom surface of the inductor device 410 with respect to a circuit board to which the inductor device 410 is attached. See further FIGS. as discussed herein. The standoffs can be fabricated from magnetic permeable material 115 or other suitable insulator material such as plastic. Thus, the cavity 420 is a void disposed between the first axial end 209-1 of the inductor device 210 and the second axial end 209-2 of the inductor device 210.

FIG. 7C is an example second side view diagram of internal components of an inductor device in FIG. 7A.

This side view diagram of the inductor device 410 illustrates connectivity of an end of the electrically conductive path 431-1 to the terminal 421 and connectivity of an end of the electrically conductive path 432-1 to the terminal 423. The side view diagram of the inductor device 410 illustrates connectivity of an end of the electrically conductive path 431-2 to the terminal 425 and connectivity of an end of the electrically conductive path 432-2 to the terminal 427. As previously discussed, the electrically conductive paths are connected to corresponding terminals at the other ends of the electrically conductive paths. For example, inductor device 410 includes connectivity of a second end of the electrically conductive path 431-1 to the terminal 422 and connectivity of a second end of the electrically conductive path 432-1 to the terminal 424. The inductor device 410 includes connectivity of a second end of the electrically conductive path 431-2 to the terminal 426 and connectivity of a second end of the electrically conductive path 432-2 to the terminal 428.

Further, the side view diagram of FIG. 1C illustrates the width of the inductor device 110 as being Z4, which can be any suitable value.

FIG. 7D is an example bottom view diagram of an inductor device in FIG. 7A.

As shown, the inductor device 410 includes a bottom surface as shown via the bottom view of FIG. 7D. Each of the terminals 421, 422, 423, 424, 425, 426, 427, and 428 on the bottom surface of the inductor device 410 can be implemented as surface mount metallic pads.

In this example, the terminal 421 and the terminal 422 are disposed on the virtual axis #71. The terminal 423 and the terminal 424 are disposed on the virtual axis #72. The virtual axis #72 is nonparallel with respect to the virtual axis #71. As previously discussed, the terminal 423 is offset (by a desired distance) with respect to the virtual axis #71; the terminal 424 is offset (by a desired distance) with respect to the virtual axis #71 as well.

The virtual axis #72 extends through the terminal 423 and the terminal 424 and crosses the virtual axis #71.

Yet further, the terminal 421 and the terminal 423 of the inductor device 410 are disposed adjacent to each other; the terminal 422 and the terminal 424 are disposed adjacent to each other.

In this example, the terminal 425 and the terminal 426 are disposed on the virtual axis #73. The terminal 427 and the terminal 428 are disposed on the virtual axis #74. The virtual axis #74 is nonparallel with respect to the axis #73. As previously discussed, the terminal 427 is offset (by a desired distance) with respect to the virtual axis #73; the terminal 428 is offset (by a desired distance) with respect to the virtual axis #73 as well.

The virtual axis #74 extends through the terminal 427 and the terminal 428 and crosses the virtual axis #73.

Yet further, the terminal 425 and the terminal 427 of the inductor device 410 are disposed adjacent to each other; the terminal 426 and the terminal 428 are disposed adjacent to each other.

Each of the terminals can be configured to be any suitable shape. For example, the first terminal 421 may be a first substantially rectangular surface mount pad; the second terminal 422 may be a second substantially rectangular surface mount pad; the third terminal 423 may be a third substantially rectangular surface mount pad; and the fourth terminal 424 may be a fourth substantially rectangular surface mount pad; the fifth terminal 425 may be a fifth substantially rectangular surface mount pad; the sixth terminal 426 may be a sixth substantially rectangular surface mount pad; the seventh terminal 427 may be a seventh substantially rectangular surface mount pad; and the eighth terminal 428 may be an eighth substantially rectangular surface mount pad.

A surface region of the terminal 423 may not overlap the axis #71; a surface region of the terminal 424 may not overlap the axis #71; a surface region of the terminal 421 may not overlap the axis #72; a surface region of the terminal 422 may not overlap the axis #72.

Additionally, a surface region of the terminal 427 may not overlap the axis #73; a surface region of the terminal 428 does not overlap the axis #73; a surface region of the terminal 425 may not overlap the axis #74; a surface region of the terminal 426 may not overlap the axis #74.

As previously discussed, FIG. 8A is an example top view diagram of an inductor device in FIG. 7A. FIG. 8B is an example side view diagram of the inductor device in FIG. 7A. FIG. 8C is an example top cutaway view of the inductor device in 410.

This illustration shows magnetic flux lines associated with current through the primary electrically conductive paths 431-1 and 431-2. Flow of current through from the terminal 421 through the electrically conductive path 431-1 to the terminal 422 produces magnetic flux 501 and magnetic flux 502 according to the right hand rule. Flow of current through from the terminal 425 through the electrically conductive path 432-1 to the terminal 426 produces magnetic flux 503 and magnetic flux 504 according to the right hand rule. Presence of the magnetic permeable material 115 in the inductor device 410 reduces any magnetic coupling between a respective pair of electrically conductive paths in the inductor device 410.

Figure 9:
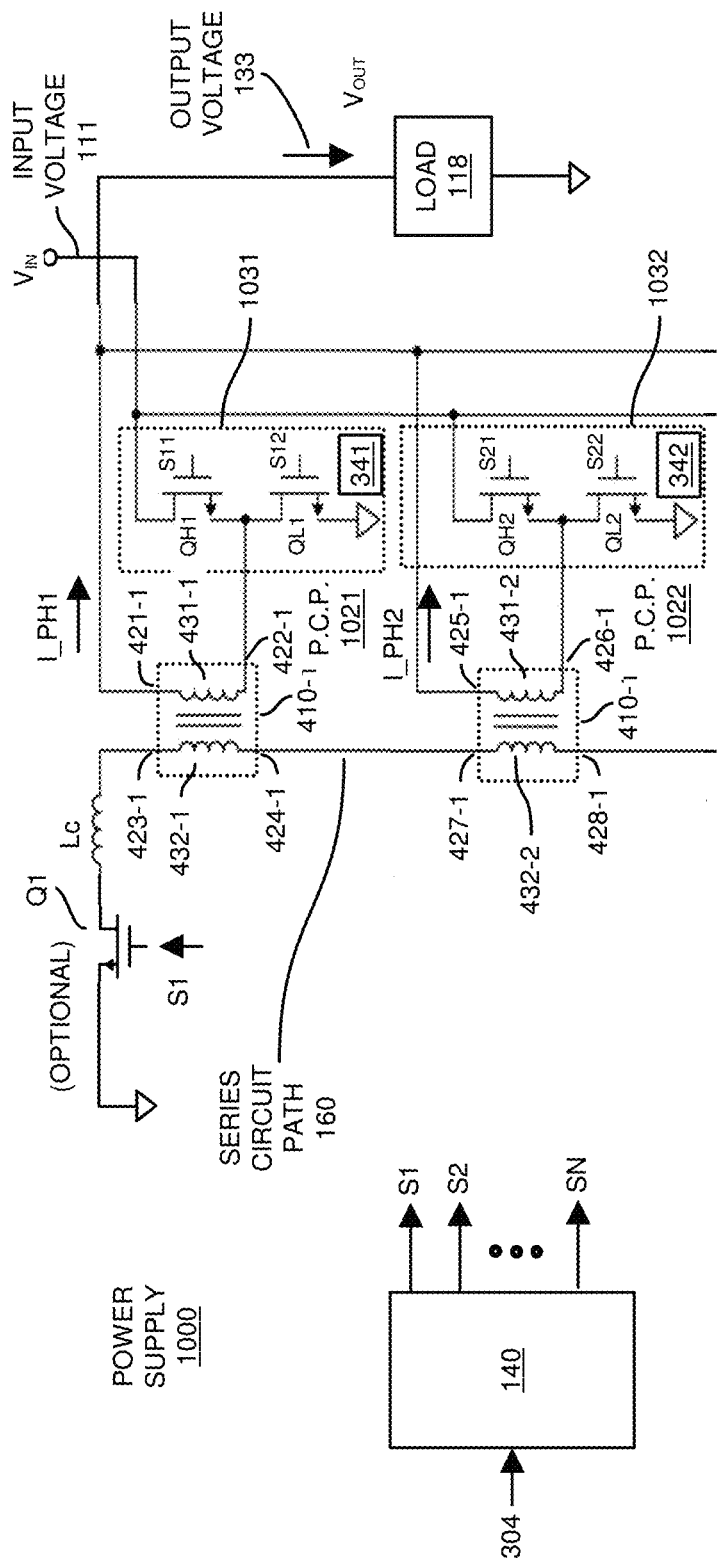
FIG. 9 is an example diagram illustrating implementation of a power supply including multiple inductor devices.

FIG. 9 is an example diagram illustrating implementation of a power supply including multiple inductor devices.

In this example, each of the power converter phases in the power supply 1000 includes a pair of switches (such as high side switch circuitry and low side switch circuitry) and one or more windings (inductive paths) to contribute to generation of the output voltage 133 to power load 118.

For example, the power converter phase 1021 includes a portion (one transformer) of inductor device 410-1 and inductive paths such as including electrically conductive path 431-1 and electrically conductive path 431-2, switch QH1 (such as high side switch circuitry), and switch QL1 (such as low side switch circuitry). Driver circuitry 341 receives control signal S1 from controller 140 and produces control signals S11 and S12 controlling switches QH1 and QL1. Switch QH1 is connected in series with switch QL1 between the input voltage 111 and a reference potential. The drain of switch QH1 receives the input voltage 111; the source of QH1 is connected to the drain of switch QL1 and contributes to producing the output voltage 133 via output current I_PH1; the source of QL1 is connected to a reference potential. Note that the reference potentials may be different. For example, note that the reference potentials as discussed herein may or may not refer to the same physical contact.

Power converter phase 1022 includes a portion (a transformer) of inductor device 410-1 and inductive paths such as including electrically conductive path 432-2 and electrically conductive path 432-2, switch QH2 (such as high side switch circuitry), and switch QL2 (such as low side switch circuitry). Driver circuitry 342 receives control signal S2 from controller 140 and produces control signals S21 and S22 controlling switches QH2 and QL2. Switch QH2 is connected in series with switch QL2 between the input voltage 111 and a reference potential. The drain of switch QH2 receives the input voltage 111; the source of QH2 is connected to the drain of switch QL2 and contributes to producing the output voltage 133 via output current I_PH2; the source of QL2 is connected to the reference potential.

The power supply 1000 includes any number of power converter phases operating in parallel to produce the output voltage 133.

Thus, the power converter phase 1021 includes inductor device 410-1 (first transformer) including electrically conductive path 431-1 magnetically (inductively) coupled to the electrically conductive path 432-1; power converter phase 1022 includes inductor device 410-1 (second transformer) including electrically conductive path 431-2 magnetically (inductively) coupled to the electrically conductive path 432-2; and so on.

In any suitable manner as previously discussed, the controller 140 generates the control signals (S1, S2, . . . , SN) depending on a magnitude of the output voltage 133 with respect to a desired setpoint reference voltage 304 as in buck converter or other suitable technology. The controller 140 controls the output voltage 133 to be substantially equal to a setpoint reference voltage 304.

Each phase includes driver circuitry. For example, power converter phase 1021 includes switch driver circuitry 341; power converter phase 1032 includes switch driver circuitry 342; and so on.

As previously discussed, driver circuitry 341 receives control signal S1 generated by the controller 140 and, based on control signal S1, produces corresponding control signal S11 controlling switch QH1 and control signal S12 controlling switch QL1. The circuitry 1031 associated with the power converter phase 1021 includes multiple components such as switch QH1, switch QL1, driver circuitry 341, etc.

Driver circuitry 342 receives control signal S2 generated by the controller 140 and, based on control signal S2, produces corresponding signals S21 controlling switch QH2 and control signal S22 controlling switch QL1. The circuitry 1032 associated with the power converter phase 1022 includes multiple components such as switch QH2, switch QL2, driver circuitry 342, etc.

In general, as in a buck converter topology, activation of corresponding high side switch circuitry in a respective power converter phase increases a magnitude of the output voltage 133; activation of the low side switch circuitry results in decreased current to the load from the energy stored in the respective primary side winding (such as electrically conductive path 131-1, 131-2, . . . , 131-N.

The electrically conductive paths (a.k.a., inductive paths) associated with the inductor device 410-1 are windings of the multiple power converter phases connected in series in the series circuit path 160. As previously discussed, each of the multiple power converter phases 1021, 1022, etc., includes a primary winding (such as electrically conductive path 431-1, 431-2, . . . ) and a secondary winding (such as electrically conductive path 432-1, 432-2, . . . ). In such an implementation, each of the electrically conductive paths 431-1, 431-2, etc., of the multiple power converter phases produces, based on control signals from the controller 140, respective phase output current (or voltage) contributing to generation of an output voltage 133 that powers a load 118. For example, the electrically conductive path 431-1 produces/outputs current I_PH1; electrically conductive path 431-2 produces/outputs current I_PH2; and so on. Each of the power converter phases are connected in series via windings (electrically conductive paths) disposed in serial circuit path 160.

Figure 10:
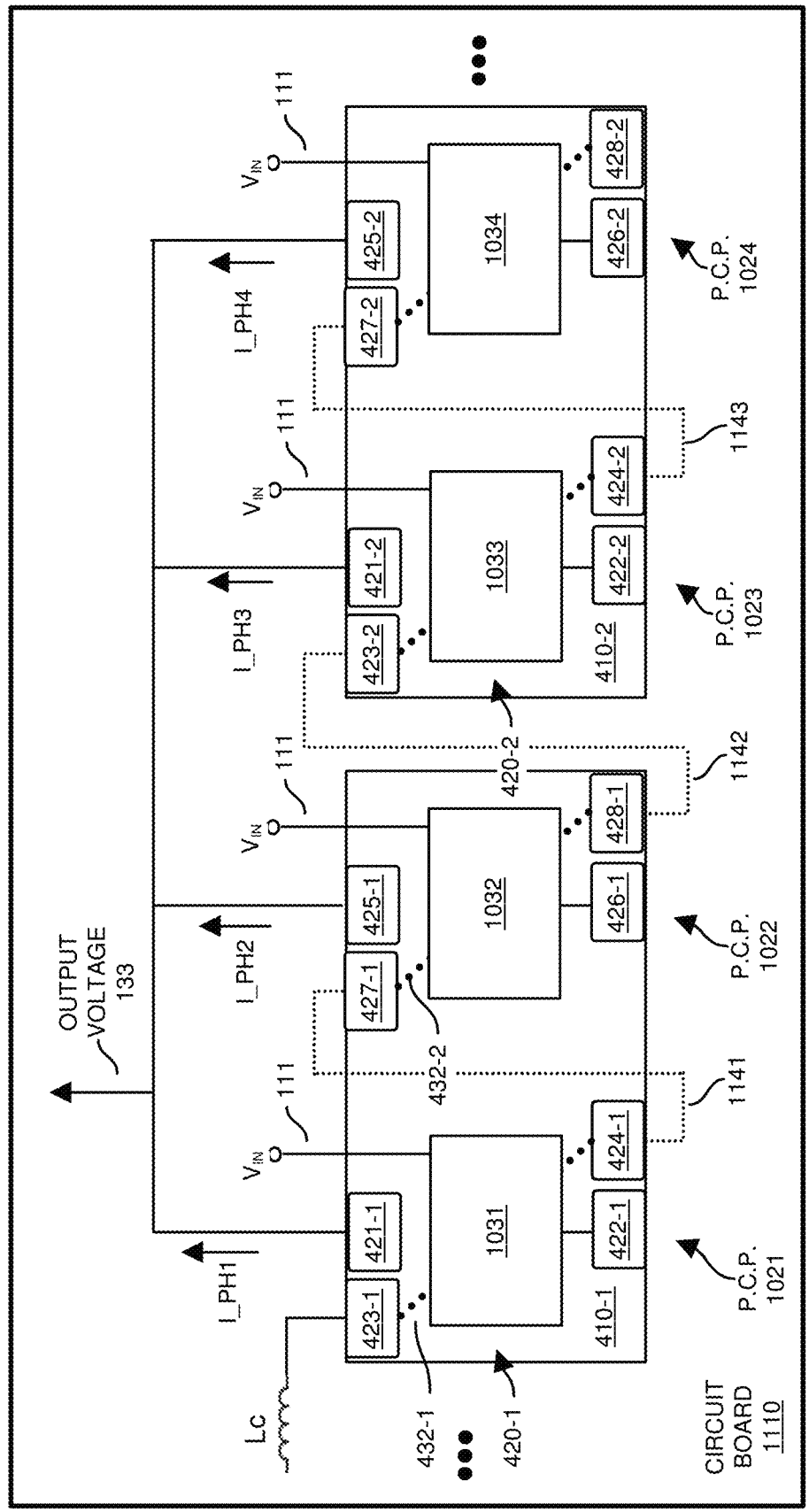
FIG. 10 is an example diagram illustrating a circuit board including multiple inductor devices.

FIG. 10 is an example diagram illustrating a circuit board including multiple inductor devices.

In this implementation, the bottom view of the circuit board 1110 illustrates connectivity of the components associated with the power supply 1000 fabricated on the circuit board 1110.

As shown in this view, the circuitry 1031 is disposed in the cavity 420-1 between the inductor device 410-1 and the corresponding circuit board 1110; the circuitry 1032 is disposed in the cavity 420-1 between the inductor device 410-1 and the corresponding circuit board 1110; the circuitry 1033 is disposed in the cavity 420-1 between the inductor device 410-2 and the corresponding circuit board 1110; the circuitry 1034 is disposed in the cavity 420-2 between the inductor device 410-2 and the corresponding circuit board 1110; and so on.

In this example, the windings of the inductor devices 410-1, 410-2, . . . are connected in series in the respective circuit path disposed on the circuit board 1110.

For example, the inductor LC is electrically coupled to the terminal 423-1 of the inductor device 410-1; the inductive path 432-1 associated with the inductor device 410-1 is internally connected in the inductor device 410-1 between the terminal 423-1 and terminal 424-1 in a manner as previously discussed; circuit path 1141 (such as a metallic trace or other suitable entity) on circuit board 1110 provides connectivity of the terminal 424-1 associated with the inductor device 410-1 to the terminal 427-1 of the inductor device 410-1; the inductive path 432-2 associated with the inductor device 410-1 is internally connected in the inductor device 410-1 between the terminal 427-1 and terminal 428-1 in a manner as previously discussed; circuit path 1142 (such as a metallic trace or other suitable entity) provides connectivity of the terminal 428-1 associated with the inductor device 410-1 to the terminal 423-2 of the inductor device 410-2; and so on.

The current generated by each of the power converter phases produces the respective output voltage 133. For example, power converter phase 1021 produces respective output current I_PH1; power converter phase 1022 produces respective output current I_PH2; power converter phase 1023 produces respective output current I_PH3; and so on.

In this manner, based on the attributes of the inductor devices 410 (such as pin layout of terminals), the inductor devices support advantageous daisy chaining to produce the series circuit path 160 of the power supply 1000. The implementation of a respective cavity associated with each inductor device (such as for circuitry 1031 and circuitry 1032 associated with inductor device 410-1) enables each power converter phase to be small in size as well as allows the driver circuitry to be located in close proximity to the inductive paths associated with the multiple power converter phases.

Figure 11:
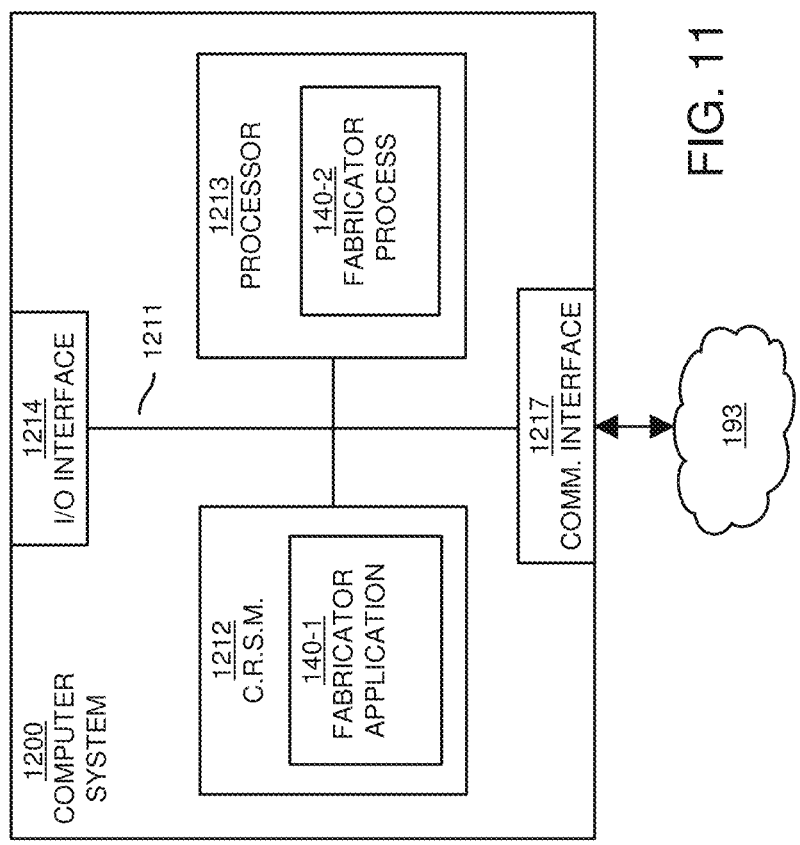
FIG. 11 is an example diagram illustrating example computer architecture (fabricator system, hardware, equipment, etc.) operable to execute one or more methods.

FIG. 11 is a diagram illustrating example computer architecture operable to execute one or more methods.

As previously discussed, any of the resources (such as controller, fabricator, manufacturing equipment, etc.) as discussed herein can be configured to include computer processor hardware and/or corresponding executable instructions to carry out the different operations as discussed herein.

As shown, computer system 1200 of the present example includes an interconnect 1211 that couples computer readable storage media (CRSM) 1212 such as a non-transitory type of media (which can be any suitable type of hardware storage medium in which digital information can be stored and retrieved), a processor 1213 (computer processor hardware), I/O interface 1214, and a communications interface 1217.

I/O interface(s) 1214 supports connectivity to external hardware 1299 such as a keyboard, display screen, repository, etc.

Computer readable storage medium 1212 can be any hardware storage device such as memory, optical storage, hard drive, floppy disk, etc. In one implementation, the computer readable storage medium 1212 stores instructions and/or data.

As shown, computer readable storage media 1212 can be encoded with fabricator application 140-1 (e.g., including instructions) to carry out any of the operations as discussed herein.

During operation, processor 1213 accesses computer readable storage media 1212 via the use of interconnect 1211 in order to launch, run, execute, interpret or otherwise perform the instructions in fabricator application 140-1 stored on computer readable storage medium 1212. Execution of the fabricator application 140-1 produces fabricator process 140-2 to carry out any of the operations and/or processes as discussed herein.

Those skilled in the art will understand that the computer system 1200 can include other processes and/or software and hardware components, such as an operating system that controls allocation and use of hardware resources to execute fabricator application 140-1.

In accordance with different implementations, note that computer system may reside in any of various types of devices, including, but not limited to, a power supply, switched-capacitor converter, power converter, a mobile computer, a personal computer system, a wireless device, a wireless access point, a base station, phone device, desktop computer, laptop, notebook, netbook computer, mainframe computer system, handheld computer, workstation, network computer, application server, storage device, a consumer electronics device such as a camera, camcorder, set top box, mobile device, video game console, handheld video game device, a peripheral device such as a switch, modem, router, set-top box, content management device, handheld remote control device, any type of computing or electronic device, etc. The computer system 1250 may reside at any location or can be included in any suitable resource in any network environment to implement functionality as discussed herein.

Figure 12:
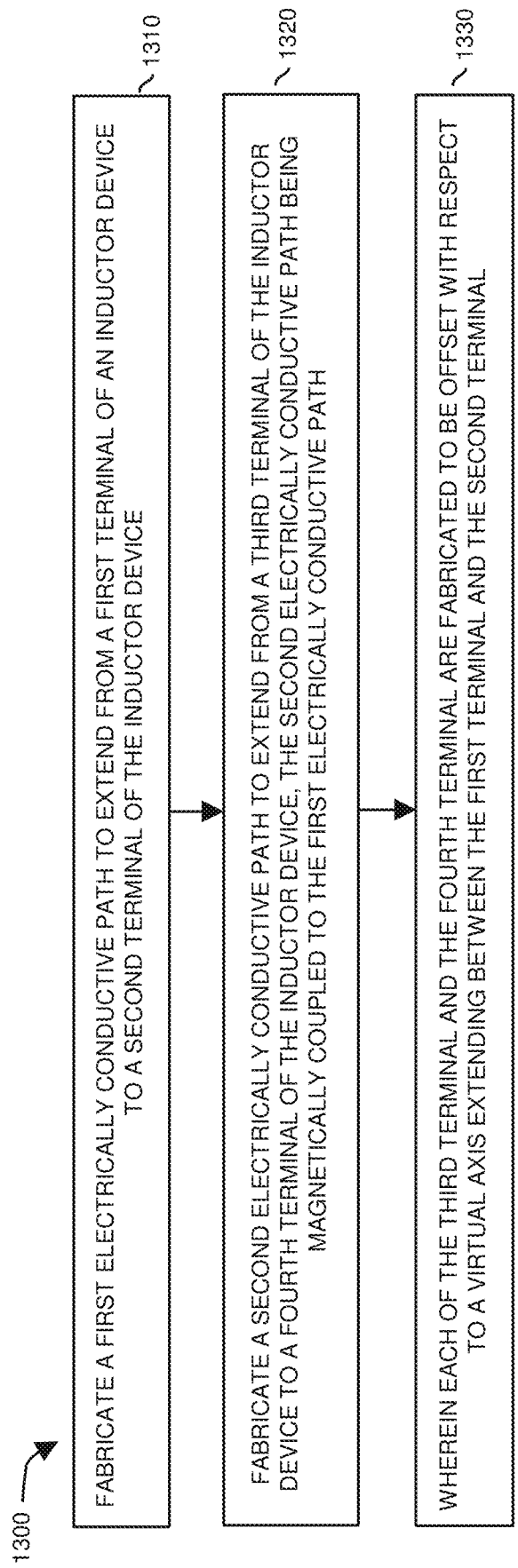
FIG. 12 is an example diagram illustrating a method of fabricating an inductor device.

Functionality supported by one or more resources as described herein are discussed via flowchart in FIG. 12. Note that the steps in the flowcharts below can be executed in any suitable order.

FIG. 12 is a flowchart 1300 illustrating an example method. Note that there will be some overlap with respect to concepts as discussed above.

In processing operation 1310, the fabricator (assembler) fabricates a first electrically conductive path to extend from a first terminal of an inductor device to a second terminal of the inductor device.

In processing operation 1320, the fabricator fabricates a second electrically conductive path to extend from a third terminal of the inductor device to a fourth terminal of the inductor device, the second electrically conductive path being magnetically coupled to the first electrically conductive path.

In processing operation 1330, each of the third terminal and the fourth terminal are fabricated to be offset with respect to a virtual axis extending through the first terminal and the second terminal.

Note again that techniques herein are well suited for use in inductor and power converter applications. However, it should be noted that implementations herein are not limited to use in such applications and that the techniques discussed herein are well suited for other applications as well.

While this invention has been particularly shown and described with references to preferred implementations thereof, it will be understood by those skilled in the art that various changes in form and details may be made therein without departing from the spirit and scope of the present application as defined by the appended claims. Such variations are intended to be covered by the scope of this present application. As such, the foregoing description of implementations of the present application is not intended to be limiting. Rather, any limitations to the invention are presented in the following claims.

The invention claimed is:

1. An inductor device comprising:
   a first electrically conductive path extending from a first terminal of the inductor device to a second terminal of the inductor device;
   a second electrically conductive path extending from a third terminal of the inductor device to a fourth terminal of the inductor device;
   a combination of the first electrically conductive path and the second electrically conductive path extending through magnetically permeable material, the second electrically conductive path being magnetically coupled to the first electrically conductive path via the magnetically permeable material; and
   each of the third terminal and the fourth terminal being offset with respect to a virtual axis extending through a center of the first terminal and a center of the second terminal.

2. The inductor device as in claim 1, wherein the first terminal and the third terminal are disposed at a first axial end of the inductor device, a surface region of the third terminal not overlapping the virtual axis; and
   wherein the second terminal and the fourth terminal are disposed at a second axial end of the inductor device opposite the first axial end, a surface region of the fourth terminal not overlapping the virtual axis.

3. The inductor device as in claim 1 further comprising:
   a core structure including the magnetically permeable material and standoffs; and
   a cavity disposed in the core structure, the cavity being a void in the core structure between the standoffs.

4. The inductor device as in claim 1, wherein the virtual axis through the center of the first terminal and the center of the second terminal is a first virtual axis; and
   wherein a second virtual axis extending through a center of the third terminal and a center of the fourth terminal is non-parallel with respect to the first virtual axis.

5. The inductor device as in claim 1, wherein the virtual axis through the center of the first terminal and the center of the second terminal is a first virtual axis; and
   wherein a second virtual axis extending through a center of the third terminal and a center of the fourth terminal crosses the first virtual axis.

6. The inductor device in claim 1, wherein the inductor device is a surface mount device;

wherein exposed surface areas of the first terminal, the second terminal, the third terminal, the fourth terminal, and the virtual axis reside in a common plane of the surface mount device; and
wherein a surface area of the third terminal and a surface area of the fourth terminal do not overlap the virtual axis.

7. The inductor device as in claim 1, wherein the virtual axis is a first virtual axis, the inductor device further comprising:
a third electrically conductive path extending from a fifth terminal of the inductor device to a sixth terminal of the inductor device;
a fourth electrically conductive path extending from a seventh terminal of the inductor device to an eighth terminal of the inductor device, the fourth electrically conductive path being magnetically coupled to the third electrically conductive path; and
each of the seventh terminal and the eighth terminal being offset with respect to a second virtual axis extending through a center of the fifth terminal and a center of the sixth terminal.

8. The inductor device of claim 7, wherein the first electrically conductive path and the second electrically conductive path are substantially magnetically isolated from the third electrically conductive path and the fourth electrically conductive path.

9. The inductor device of claim 1, wherein the first electrically conductive path comprises a first U-shaped winding of a transformer; and
wherein the second electrically conductive path comprises a second U-shaped winding of the transformer.

10. The inductor device as in claim 7 further comprising:
insulator material disposed through and enveloping the first electrically conductive path and the second electrically conductive path; and
wherein the magnetically permeable material encapsulates the insulator material enveloping the first electrically conductive path and the second electrically conductive path.

11. An assembly comprising:
the inductor device of claim 7;
a first circuit path electrically connecting the second terminal to the seventh terminal; and
a second circuit path electrically connecting the first terminal to the fifth terminal.

12. A first circuit assembly comprising:
a first substrate;
the inductor device as in claim 1 disposed on a surface of the first substrate; and
a circuit component mounted to the surface of the first substrate, the circuit component disposed between the first substrate and the inductor device.

13. The first circuit assembly as in claim 12, wherein the circuit component includes a node coupling a first transistor in series with a second transistor, the node electrically coupled to the fourth terminal; and
wherein the first transistor and second transistor are operative to control a magnitude of current through the second electrically conductive path.

14. A second circuit assembly comprising:
a second substrate; and
wherein the inductor device of claim 12 is electrically connected to the second substrate.

15. A circuit assembly comprising:
a first instance of the inductor device of claim 1 coupled to a substrate;

a second instance of the inductor device of claim 1 coupled to the substrate; and
wherein the substrate is operative to provide connectivity of the third terminal of the first instance of the inductor device to the second terminal of the second instance of the inductor device.

16. A circuit assembly comprising:
the inductor device of claim 1 coupled to a substrate, the inductor device including a bottom surface;
wherein the first terminal, the second terminal, the third terminal, and the fourth terminal are implemented as metallic pads disposed on the bottom surface of the inductor device, the inductor device further comprising:
a second surface disposed opposite the first surface, a portion of the first electrically conductive path exposed on the first surface; and
wherein the substrate provides electrical connectivity between the second terminal and the seventh terminal.

17. The inductor device as in claim 1, wherein the virtual axis is a first virtual axis;
wherein the first terminal and the third terminal are disposed on a second virtual axis, the second virtual axis being substantially perpendicular to the first virtual axis; and
wherein the second terminal and the fourth terminal are disposed on a third virtual axis, the third virtual axis being substantially perpendicular to the first virtual axis.

18. The inductor device as in claim 17, wherein the second virtual axis is parallel to the third virtual axis.

19. The inductor device as in claim 1, wherein the third terminal and the fourth terminal are not disposed along the virtual axis through the first terminal and the second terminal.

20. The inductor device as in claim 1, wherein the third terminal and the fourth terminal are not disposed in a space between the first terminal and the second terminal.

21. The inductor device as in claim 1, wherein the first electrically conductive path has a lower resistivity than the second electrically conductive path.

22. The inductor device of claim 1, wherein the first terminal is a first substantially rectangular surface mount pad;
wherein the second terminal is a second substantially rectangular surface mount pad;
wherein the third terminal is a third substantially rectangular surface mount pad; and
wherein the fourth terminal is a fourth substantially rectangular surface mount pad.

23. The inductor device of claim 1, wherein the third terminal and the fourth terminal are disposed on opposite sides of the virtual axis.

24. The inductor device of claim 1, wherein the third terminal and the fourth terminal are disposed on a same side of the virtual axis.

25. The inductor device as in claim 1, wherein the first electrically conductive path is disposed in parallel with the second electrically conductive path through the magnetically permeable material.

26. The inductor device as in claim 25, wherein the virtual axis is a first axis;
wherein a first portion of the first electrically conductive path and a first portion of the second electrically conductive path are disposed in parallel along a second axis;

wherein a second portion of the first electrically conductive path and a second portion of the second electrically conductive path are disposed in parallel along a third axis; and wherein a third portion of the first electrically conductive path and a third portion of the second electrically conductive path are disposed in parallel along a fourth axis.

27. The inductor device as in claim 26, wherein the third axis is disposed in parallel with the first axis.

28. The inductor device as in claim 27, wherein the third terminal and the fourth terminal are offset on opposite sides of the virtual axis.

29. The inductor device is in claim 27, wherein the magnetically permeable material is absent between the first electrically conductive path and the second electrically conductive path.

30. The inductor device as in claim 27 further comprising:
insulator material separating the first electrically conductive path and the second electrically conductive path; and wherein the magnetically permeable material envelops a combination of the first electrically conductive path, the insulator material, and the second electrically conductive path.

31. The inductor device as in claim 30, wherein the first electrically conductive path is U-shaped in which a first node of the first electrically conductive path is directly coupled to the first terminal of the inductor device and a second node of the first electrically conductive path is directly coupled to the second terminal of the inductor device; and wherein the second electrically conductive path is U-shaped in which a first node of the second electrically conductive path is directly coupled to the third terminal of the inductor device and a second node of the second electrically conductive path is directly coupled to the fourth terminal of the inductor device.

32. The inductor device as in claim 1, wherein the magnetically permeable material is absent between the first electrically conductive path and the second electrically conductive path.

33. The inductor device as in claim 1 further comprising:
insulator material separating the first electrically conductive path and the second electrically conductive path; and wherein the magnetically permeable material envelops a combination of the first electrically conductive path, the insulator material, and the second electrically conductive path.

34. The inductor device as in claim 33, wherein flow of current through the first electrically conductive path is operative to produce magnetic flux in the magnetically permeable material.

35. The inductor device as in claim 34, wherein the third terminal and the fourth terminal are offset on different sides of the virtual axis.

* * * * *